United States Patent
Nakanishi et al.

(10) Patent No.: US 7,456,668 B2
(45) Date of Patent: Nov. 25, 2008

(54) PULSE WIDTH MODULATION CIRCUIT AND SWITCHING AMPLIFIER USING THE SAME

(75) Inventors: Yoshinori Nakanishi, Neyagawa (JP); Mamoru Sekiya, Neyagawa (JP)

(73) Assignee: Onkyo Corporation, Neyagawa (JP)

( * ) Notice: Subject to any disclaimer, the term of this patent is extended or adjusted under 35 U.S.C. 154(b) by 0 days.

(21) Appl. No.: 11/874,956

(22) Filed: Oct. 19, 2007

(65) Prior Publication Data

US 2008/0174351 A1  Jul. 24, 2008

(30) Foreign Application Priority Data

Jan. 22, 2007 (JP) ............... 2007-011251
Aug. 27, 2007 (JP) ............... 2007-219425

(51) Int. Cl.
*H03K 3/017* (2006.01)

(52) U.S. Cl. .................. 327/176; 327/172; 327/33; 327/291

(58) Field of Classification Search ......... 327/171–176, 327/31, 33, 35, 94, 291, 298
See application file for complete search history.

(56) References Cited

U.S. PATENT DOCUMENTS 4,827,261 A   5/1989   Trofimenkoff et al. ...... 341/157

(Continued)

FOREIGN PATENT DOCUMENTS

JP          05-275995        10/1993

(Continued)

OTHER PUBLICATIONS

Horowitz, P. and Hill W.; "The Art of Electronics"; 1991 Cambridge University Press, New York, NY, USA; XP002486215, pp. 625 and 627.

*Primary Examiner*—An T Luu
(74) *Attorney, Agent, or Firm*—Renner, Otto, Boisselle & Sklar, LLP

(57) ABSTRACT

A pulse width modulation circuit 1 of the present invention changes the voltage of a first integration circuit C1 during the first period T1 of the clock signal MCLK based on a current based on an audio signal eS, changes the voltage of the first integration circuit C1 based on a constant bias current in the opposite direction while changing the voltage of a second integration circuit C2 during the second period T2, and changes the voltage of the second integration circuit C2 based on the bias current during the third period T3. The amount of time from the start of the second period T2 until the voltage of the first integration circuit C1 reaches the reference voltage Vth is detected, and the amount of time from the start of the third period T3 until the voltage of the second integration circuit C2 reaches the reference voltage Vth is detected. The voltage of the first integration circuit C1 is kept at the reference voltage Vth from when the voltage of the first integration circuit C1 reaches the reference voltage Vth until the start of the third period T3, and the voltage of the second integration circuit C2 is kept at the reference voltage Vth from when the voltage of the second integration circuit C2 reaches the reference voltage Vth until the start of the fourth period T4. A pulse signal is generated, in which the pulse widths are equal to the amounts of time required for first and second integration circuits C1 and C2 to reach the reference voltage Vth.

11 Claims, 20 Drawing Sheets

U.S. PATENT DOCUMENTS

| | | | |
|---|---|---|---|
| 6,420,930 B1 * | 7/2002 | Takagishi | 330/251 |
| 7,312,657 B2 | 12/2007 | Kurokawa | |
| 2006/0077005 A1 | 4/2006 | Lee et al. | 330/10 |

FOREIGN PATENT DOCUMENTS

| | | |
|---|---|---|
| JP | 2004-320097 | 11/2004 |
| JP | 2005-303814 | 10/2005 |
| WO | 93/25002 | 12/1993 |

* cited by examiner f0 f0

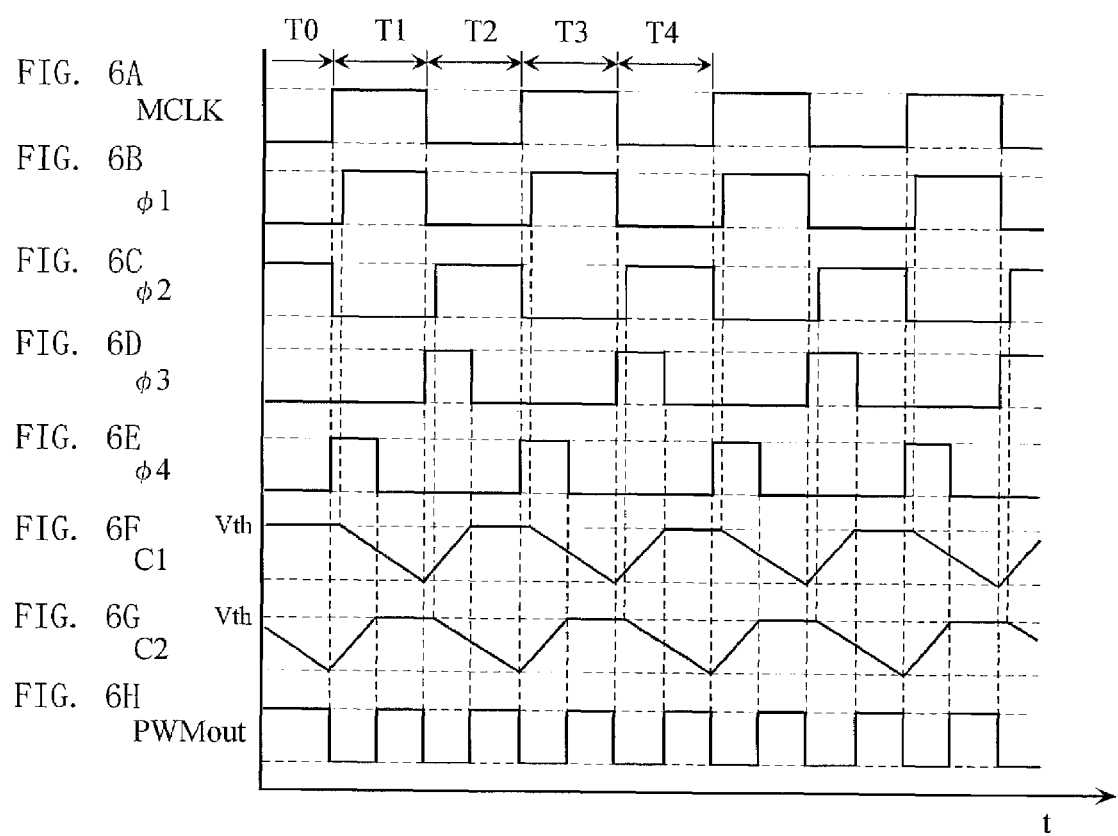

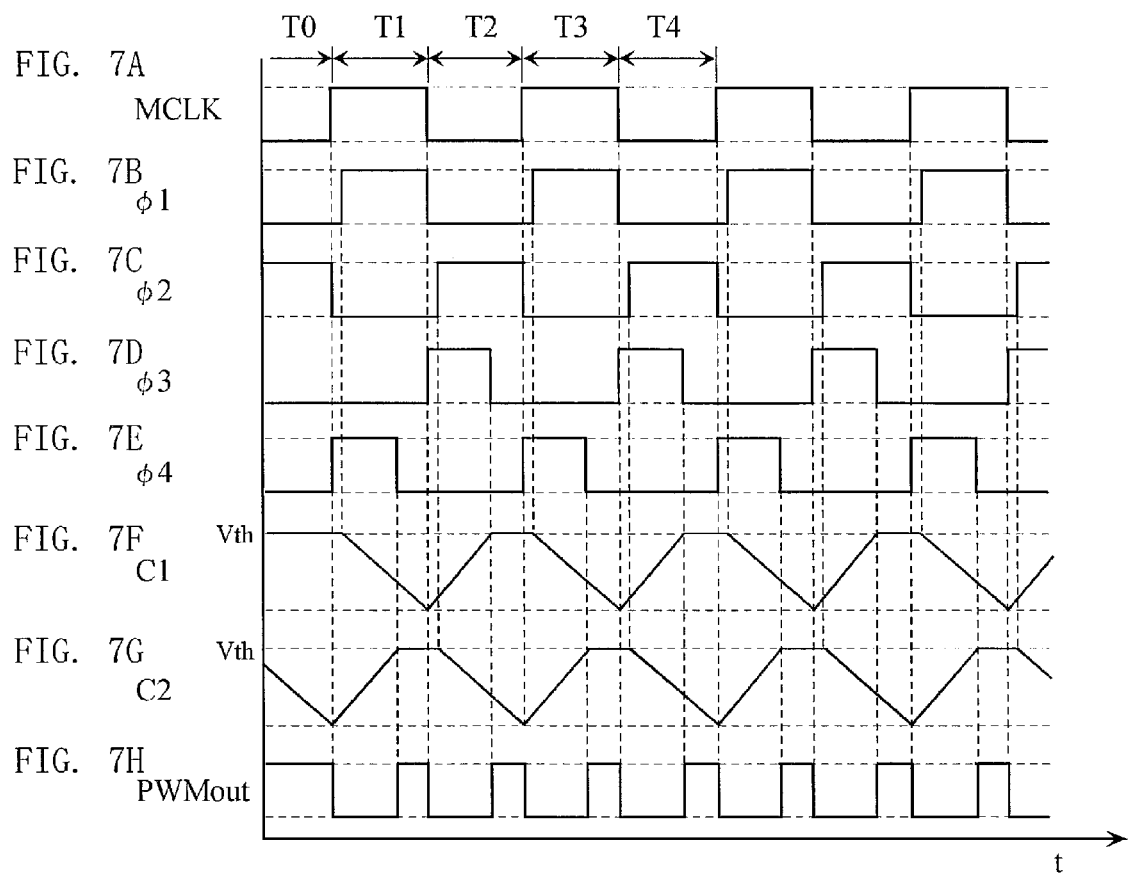

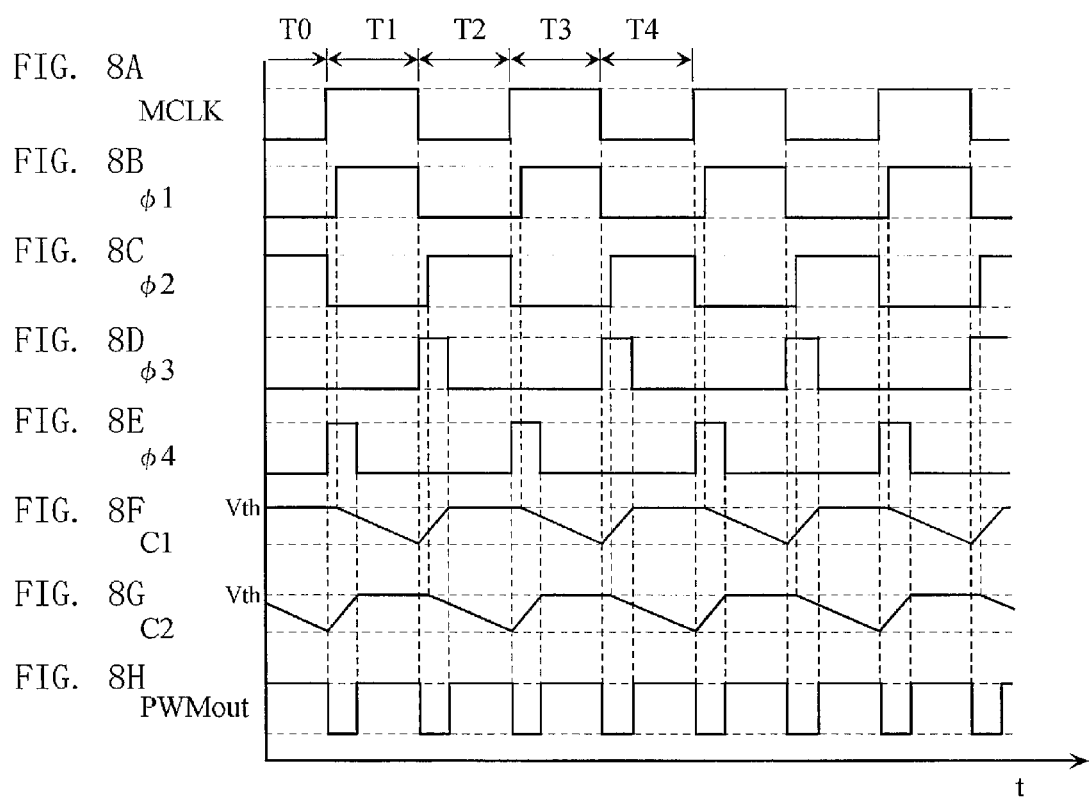

FIG. 18 PRIOR ART
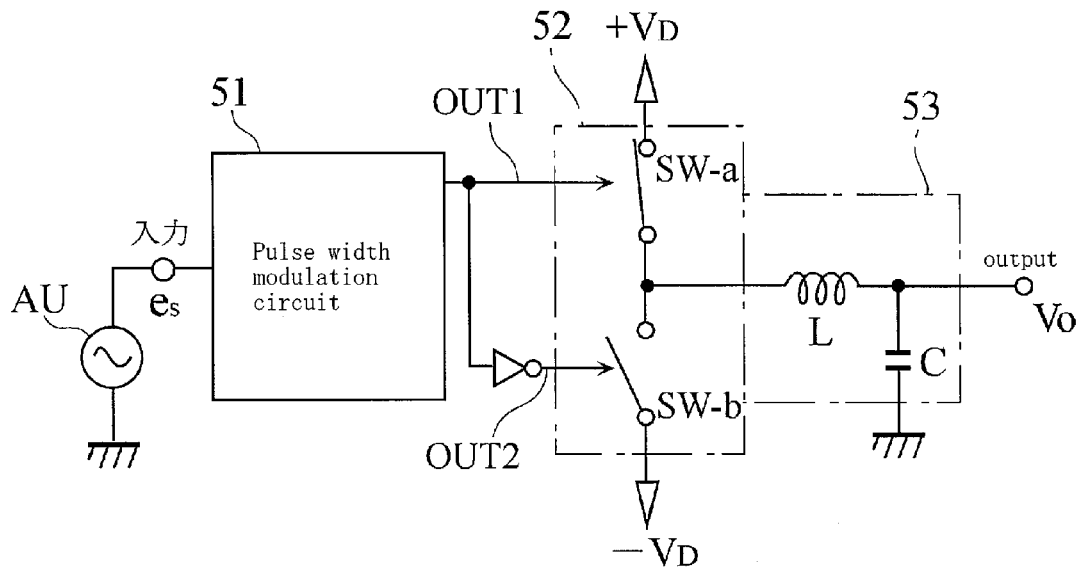
FIG. 19 PRIOR ART
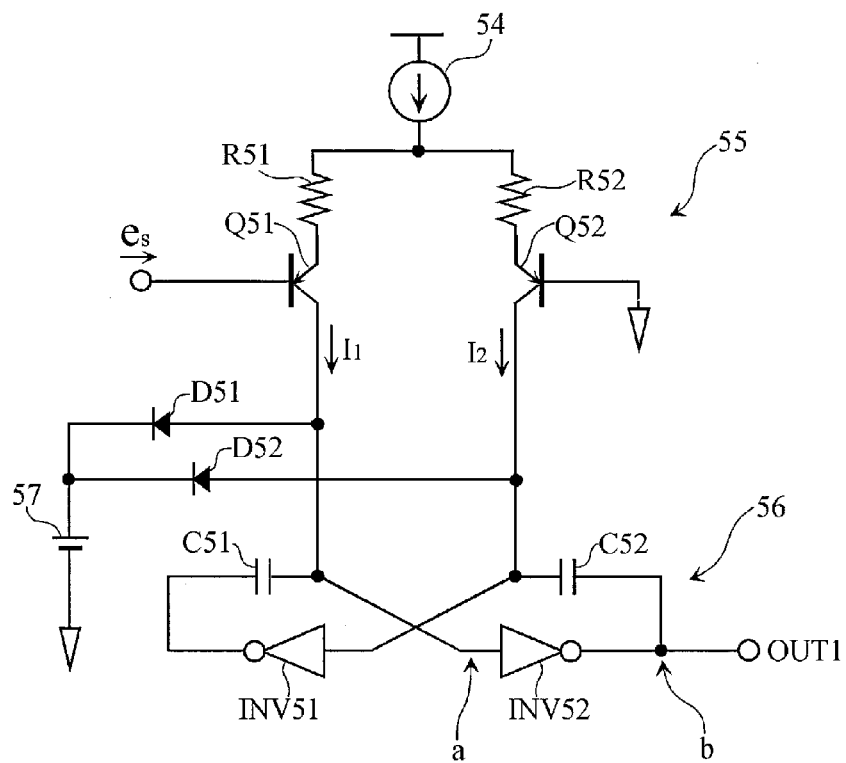

FIG. 20A PRIOR ART
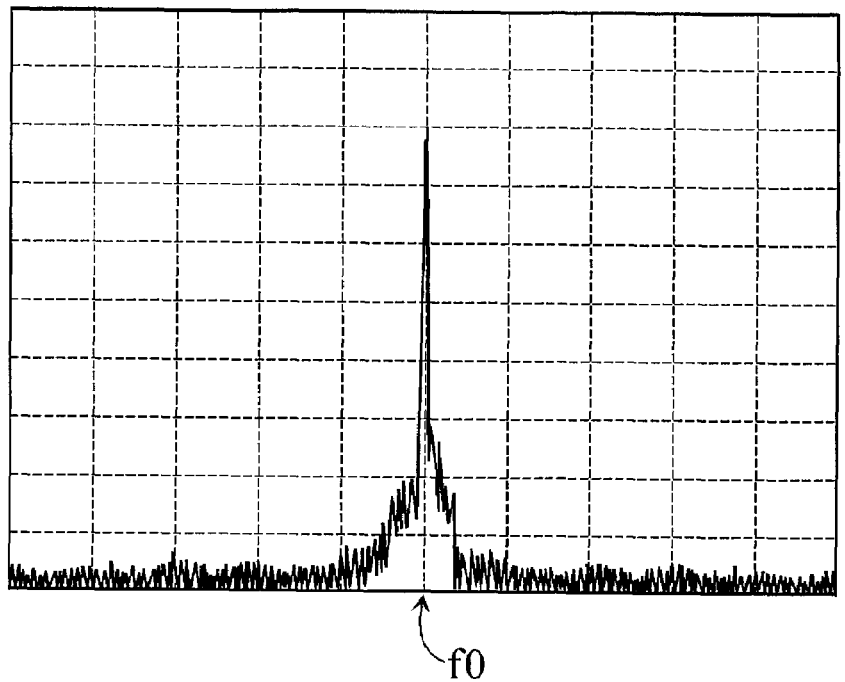
f0
FIG. 20B PRIOR ART
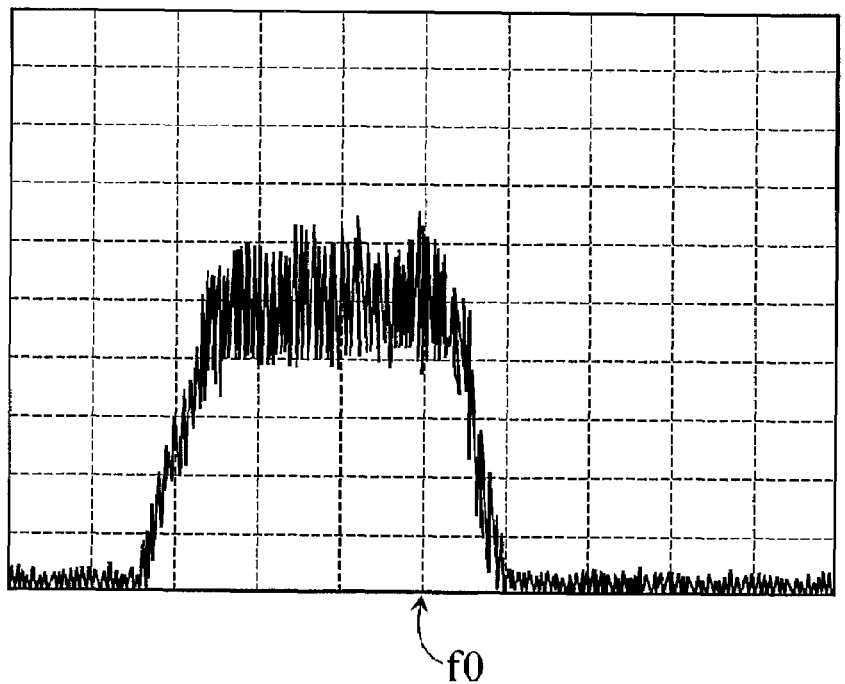
f0

PULSE WIDTH MODULATION CIRCUIT AND SWITCHING AMPLIFIER USING THE SAME

BACKGROUND OF THE INVENTION

1. Field of the Invention

The present invention relates to a pulse width modulation circuit for, for example, performing a pulse width modulation (PWM) on an audio signal to output the modulated signal, and a switching amplifier using the same (e.g., an audio amplifier)

2. Description of the Related Art

For example, a type of a conventional switching amplifier proposed in the art uses a pulse width modulation circuit for performing a pulse width modulation on an audio signal as the input signal to output the modulated signal (see, for example, Japanese Laid-Open Patent Publication No. 2004-320097). With the switching amplifier, a predetermined power source voltage is switched ON and OFF based on the modulated signal output from the pulse width modulation circuit, and the output signal switched ON and OFF is output to a load (e.g., a speaker) through a low-pass filter, for example.

FIG. 18 shows a configuration of an example of a conventional switching amplifier. The switching amplifier includes a pulse width modulation circuit 51 connected to an audio signal generation source AU, a switching circuit 52, and a low-pass filter 53. With the switching amplifier, an audio signal eS output from the audio signal generation source AU is input to the pulse width modulation circuit 51, where a pulse width modulation is performed on the amplitude of the audio signal eS. As a result, a modulated signal OUT1 and a modulated signal OUT2 in opposite phase to the modulated signal OUT1 are output to the switching circuit 52.

In the switching circuit 52, the positive and negative power source voltages +VD and −VD are alternately switched ON and OFF by switches SW-a and SW-b, respectively, based on the modulated signals OUT1 and OUT2. The output being switched ON and OFF passes through the low-pass filter 53, where a high-frequency component thereof is removed, and is supplied to a load (not shown) as an output signal FIG. 19 is a circuit diagram showing a schematic configuration of the pulse width modulation circuit 51 shown in FIG. 18.

The pulse width modulation circuit 51 is an integration-type pulse width modulation circuit using an a stable multi-vibrator, for example, for performing a pulse width modulation on the audio signal eS as the input signal to produce and output the modulated signal OUT1, for example.

As shown in FIG. 19, the pulse width modulation circuit 51 includes a bias current source 54, a modulation circuit 55 connected to the bias current source 54, and a pulse generation circuit 56 connected to the modulation circuit 55. The bias current source 54 is for supplying a bias current to the modulation circuit 55.

The modulation circuit 55 is implemented by a so-called differential amplifier circuit, and includes resistors R51 and R52 first ends of which are connected to each other, and transistors Q51 and Q52 connected to the second ends of the resistors R51 and R52, respectively. The modulation circuit 55 varies the current distribution ratio between first and second currents I1 and I2, which flow through the transistors Q51 and Q52, respectively, according to the audio signal eS.

The pulse generation circuit 56 is a circuit for producing a pulse signal being a signal to be modulated, i.e., a carrier of a PWM signal, and includes first and second charge condensers C51 and C52, first and second inverters INV51 and INV52, first and second diodes D51 and D52, and a power source voltage 57. The pulse generation circuit 56 charges the first and second charge condensers C51 and C52 based on the first and second currents I1 and I2 supplied from the modulation circuit 55 to output the modulated signal OUT1 whose pulse width corresponds to the charging time of the first charge condenser C51. Note that the predetermined power source voltage 57 is connected to the cathode side of each of the first and second diodes D51 and D52.

With the conventional pulse width modulation circuit 51, the frequency f of the carrier of a PWM signal (hereinafter referred to as the "carrier frequency") is dependent on the bias current of the bias current source 54, the capacitances of the first and second condensers C51 and C52, the threshold voltages Vth of the first and second inverters INV51 and INV52, etc. Therefore, where the pulse width modulation circuit 51 is used in a multi-channel switching amplifier having a plurality of channels, the carrier frequency f will vary slightly among different channels if there are variations in the capacitances of the first and second condensers C51 and C52, etc.

FIG. 20A shows a spectrum waveform of a carrier in the conventional pulse width modulation circuit 51 where the audio signal eS is absent, and FIG. 20B shows the same during a modulation operation. Note that the expression "the audio signal is absent" as used herein may either mean there is no audio signal being input or refer to a silent portion of an audio signal being input. As shown in the figures, the carrier frequency f is kept at a predetermined frequency f0 when the audio signal eS is absent, but the carrier frequency f is off the predetermined frequency f0 during a modulation operation.

As described above, with the conventional pulse width modulation circuit 51, circuits for different channels separately generate the carrier frequency f. Therefore, the carrier frequency f will vary among different channels. Where the carrier frequency f varies slightly among different channels, a beat component between signals to be modulated (carriers) is mixed in the audio frequency component, and a beat sound may be output as noise. Therefore, a sound whose sound quality is slightly altered is output from the load (speaker) as noise within the audible range.

Moreover, in order to perform an appropriate pulse width modulation operation with the pulse width modulation circuit 51 shown in FIG. 19, charges that have been stored in the first and second charge condensers C51 and C52 during a charge period need to be rapidly discharged to bring the charges in the first and second charge condensers C51 and C52 to a predetermined amount before starting to charge the first and second charge condensers C51 and C52 again.

FIGS. 21A and 21B show voltage waveforms at the point a and the point b in FIG. 19, respectively. The voltage waveform at the point a is a voltage waveform before the second inverter INV52, and the charge stored during a charge period is supposedly discharged and brought back to a predetermined amount. Thus, the voltage before the second inverter INV52 is brought back to the level SL as shown in A1 of FIG. 21A. However, the circuit includes a predetermined time constant, and the charge may not be brought back to a predetermined amount due to the time constant, whereby the next charge period may start before with the stored charge having been not sufficiently discharged (see A2 of FIG. 21A).

Then, the modulated signal OUT1 being a voltage after the second inverter INV52 (see the point b in FIG. 19) will have a pulse width with a conversion error (see B2 of FIG. 21B) as opposed to the normal pulse width (see B1 of FIG. 21B). If such a conversion error occurs during the conversion of the audio signal eS into a PWM signal, it will be impossible to perform an appropriate pulse width modulation, thus significantly influencing the sound quality.

The present invention has been made in view of the above, and it is an object of the present invention to provide a pulse modulation circuit with which the carrier frequency is made substantially constant, thus allowing for an appropriate pulse width modulation, and a switching amplifier using the same.

SUMMARY OF THE INVENTION

To address the problem set forth above, the present invention provides the following technical solutions.

According to a first aspect of the present invention, there is provided a pulse width modulation circuit, including: a voltage control circuit for changing a voltage of a first integration circuit based on a current based on an input signal during a first period, being equal to half a cycle of a predetermined clock signal, changing the voltage of the first integration circuit based on a constant bias current in a direction opposite to an increase/decrease direction in the first period while changing a voltage of a second integration circuit being different from the first integration circuit based on a current based on the input signal during a second period shifted from the first period by half a cycle and following the first period, and changing the voltage of the second integration circuit based on the bias current during a third period shifted from the second period by half a cycle and following the second period in a direction opposite to an increase/decrease direction in the second period; a first detection circuit for detecting an amount of time from a start of the second period until the voltage of the first integration circuit reaches a predetermined reference voltage; a second detection circuit for detecting an amount of time from a start of the third period until the voltage of the second integration circuit reaches a predetermined reference voltage; a first voltage keeping circuit for keeping the voltage of the first integration circuit at the reference voltage from when the voltage of the first integration circuit reaches the reference voltage until the start of the third period; a second voltage keeping circuit for keeping the voltage of the second integration circuit at the reference voltage from when the voltage of the second integration circuit reaches the reference voltage until a start of a fourth period shifted from the third period by half a cycle and following the third period; and a pulse signal generation circuit for generating a pulse signal whose pulse width is equal to the amount of time, which is output alternately from the first detection circuit and the second detection circuit every half cycle of the clock signal.

With such a configuration, in the first period, being equal to half a cycle of the clock signal, the voltage of the first integration circuit is changed (e.g., charged in the negative direction) based on the current based on the input signal (e.g., an audio signal). In the following second period, the voltage of the first integration circuit, which has been changed in the first period, is changed in the direction opposite to the increase/decrease direction in the first period (e.g., charged in the positive direction) based on the constant bias current. In the second period, the voltage of the second integration circuit is changed based on the current based on the input signal. In the following third period, the voltage of the second integration circuit, which has been changed in the second period, is changed in the direction opposite to the increase/decrease direction in the second period based on the constant bias current.

In the second period, the amount of time from the start of the second period until the voltage of the first integration circuit reaches the predetermined reference voltage is detected, and in the third period, the amount of time from the start of the third period until the voltage of the second integration circuit reaches the predetermined reference voltage is detected. These detected amounts of time are repeatedly and alternately output every half a cycle of the clock signal, and a pulse signal is produced whose pulse width for any period is equal to the detected amount of time for that period.

The amount of time from the start of the second period until the voltage of the first integration circuit reaches the predetermined reference voltage is dependent on the amount by which the voltage of the first integration circuit has been changed based on the current based on the input signal during the first period. The amount of time from the start of the third period until the voltage of the second integration circuit reaches the predetermined reference voltage is dependent on the amount by which the voltage of the second integration circuit has been changed based on the current based on the input signal during the second period. Thus, it is possible to produce a pulse width according to the input signal based on the amounts of voltage of the first integration circuit and the second integration circuit. Then, since a clock signal having a substantially constant cycle is used, it is possible to perform a pulse width modulation with a substantially constant carrier frequency. Therefore, even if the pulse width modulation circuit is used in a multi-channel switching amplifier having a plurality of channels, there will be no slight variations in the carrier frequency among different channels, and it is possible to suppress the mixing of a beat component between carriers in the audio frequency component.

It is preferred that the pulse width modulation circuit of the present invention includes: a first charging circuit for charging the first integration circuit in a negative direction with respect to a ground potential during the first period; and a second charging circuit for charging the second integration circuit in a negative direction with respect to the ground potential during the second period.

It is preferred that the voltage control circuit of the pulse width modulation circuit of the present invention includes: a first discharging circuit for discharging the first integration circuit based on the constant bias current at a constant rate of discharge in a positive direction with respect to the ground potential during the second period; and a second discharging circuit for discharging the second integration circuit based on the constant bias current at a constant rate of discharge in a positive direction with respect to the ground potential during the third period.

In the pulse width modulation circuit of the present invention, it is preferred that the voltage control circuit includes a voltage-current conversion circuit for converting a voltage based on the input signal; and the voltage control circuit charges the first integration circuit by means of the first charging circuit based on the current obtained by the voltage-current conversion circuit during the first period, and charges the second integration circuit by means of the second charging circuit based on the current obtained by the voltage-current conversion circuit during the second period.

It is preferred that the pulse width modulation circuit of the present invention further includes a switching signal generation circuit for generating a switching signal defining a timing for switching between the various periods based on the clock signal.

In the pulse width modulation circuit of the present invention, it is preferred that the first detection circuit includes a first calculation circuit for calculating an NOR between the switching signal generated by the switching signal generation circuit and a charge voltage stored in the first integration circuit during the second period; the second detection circuit comprises a second calculation circuit for calculating an NOR between the switching signal generated by the switching signal generation circuit and a charge voltage stored in the second integration circuit during the third period; and the pulse signal generation circuit generates the pulse signal based on an output of the first calculation circuit and an output of the second calculation circuit.

In the pulse width modulation circuit of the present invention, it is preferred that the first detection circuit includes a first comparison circuit for comparing a charge voltage stored in the first integration circuit during the second period with a predetermined reference voltage; the second detection circuit includes a second comparison circuit for comparing a charge voltage stored in the second integration circuit during the third period with a predetermined reference voltage; and the pulse signal generation circuit generates the pulse signal based on an output of the first comparison circuit and an output of the second comparison circuit.

In the pulse width modulation circuit of the present invention, it is preferred that a primary reference line through which a power source current flows for supplying a power source is provided so as to connect together the various circuits; a part of the voltage control circuit, the first integration circuit and the first comparison circuit are connected together by a common first reference line; the first reference line is connected to the primary reference line; another part of the voltage control circuit, the second integration circuit and the second comparison circuit are connected together by a common second reference line; the second reference line is connected to the primary reference line; and the pulse signal generation circuit is connected directly to the primary reference line.

It is preferred that the pulse width modulation circuit of the present invention further includes a switching signal generation circuit for generating a switching signal defining a timing for switching between the various periods based on the clock signal; and a fall detection circuit for detecting a falling edge of the switching signal generated by the switching signal generation circuit, wherein: the first detection circuit is implemented by a first flip flop circuit that receives, as a reset signal, a charge voltage stored in the first integration circuit during the second period and receives, as a set signal, a falling edge signal of the switching signal detected by the fall detection circuit; the second detection circuit is implemented by a second flip flop circuit that receives, as a reset signal, a charge voltage stored in the second integration circuit during the third period and receives, as a set signal, a falling edge signal of the switching signal detected by the fall detection circuit; and the pulse signal generation circuit generates the pulse signal based on an output of the first flip flop circuit and an output of the second flip flop circuit.

It is preferred that the pulse width modulation circuit of the present invention further includes a clock generation circuit for generating the clock signal.

According to a second aspect of the present invention, there is provided a switching amplifier, including: the pulse width modulation circuit provided according to the first aspect of the present invention; a voltage source for outputting a predetermined power source voltage; and a switching circuit for switching the predetermined power source voltage supplied from the voltage source based on a modulated signal output from the pulse width modulation circuit.

With such a configuration, the switching amplifier includes the pulse width modulation circuit provided according to the first aspect of the present invention. Therefore, it is possible to realize functions and effects similar to those of the pulse width modulation circuit provided according to the first aspect.

Other features and advantages of the present invention will become more apparent from the detailed description below taken in conjunction with the accompanying drawings.

BRIEF DESCRIPTION OF THE DRAWINGS

FIGS. 6A to 6H are timing diagrams showing the voltage waveforms of various signals where the audio signal is absent.

FIGS. 7A to 7H are timing diagrams showing the voltage waveforms of various signals where the audio signal is positive.

FIGS. 8A to 8H are timing diagrams showing the voltage waveforms of various signals where the audio signal is negative.

FIG. 18 shows a configuration of a switching amplifier using a conventional pulse width modulation circuit.

FIG. 19 is a circuit diagram showing the conventional pulse width modulation circuit.

FIG. 20A shows the spectrum waveform of a carrier in the conventional pulse width modulation circuit where the audio signal is absent, and FIG. 20B shows the same during a modulation operation.

DETAILED DESCRIPTION OF THE PREFERRED EMBODIMENTS

Preferred embodiments of the present invention will now be described in detail with reference to the accompanying drawings.

First Embodiment

Figure 1:
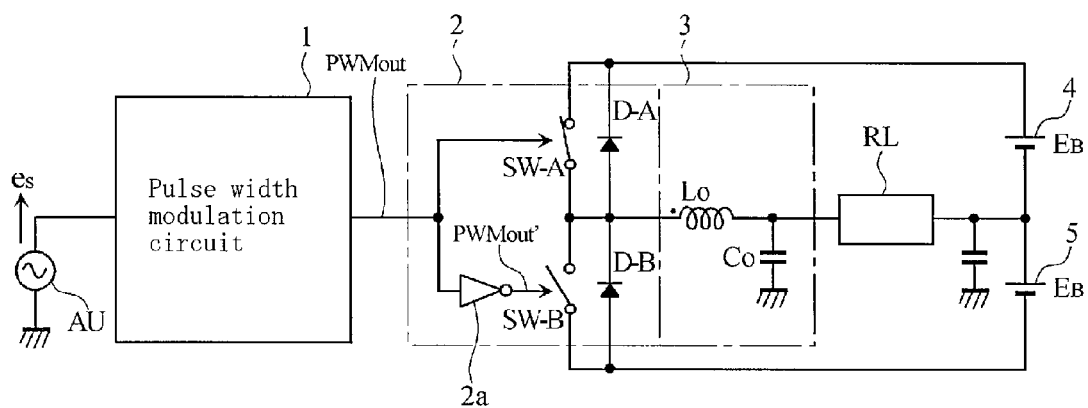
FIG. 1 shows a configuration of a switching amplifier using a pulse width modulation circuit according to a first embodiment of the present invention.
Figure 2:
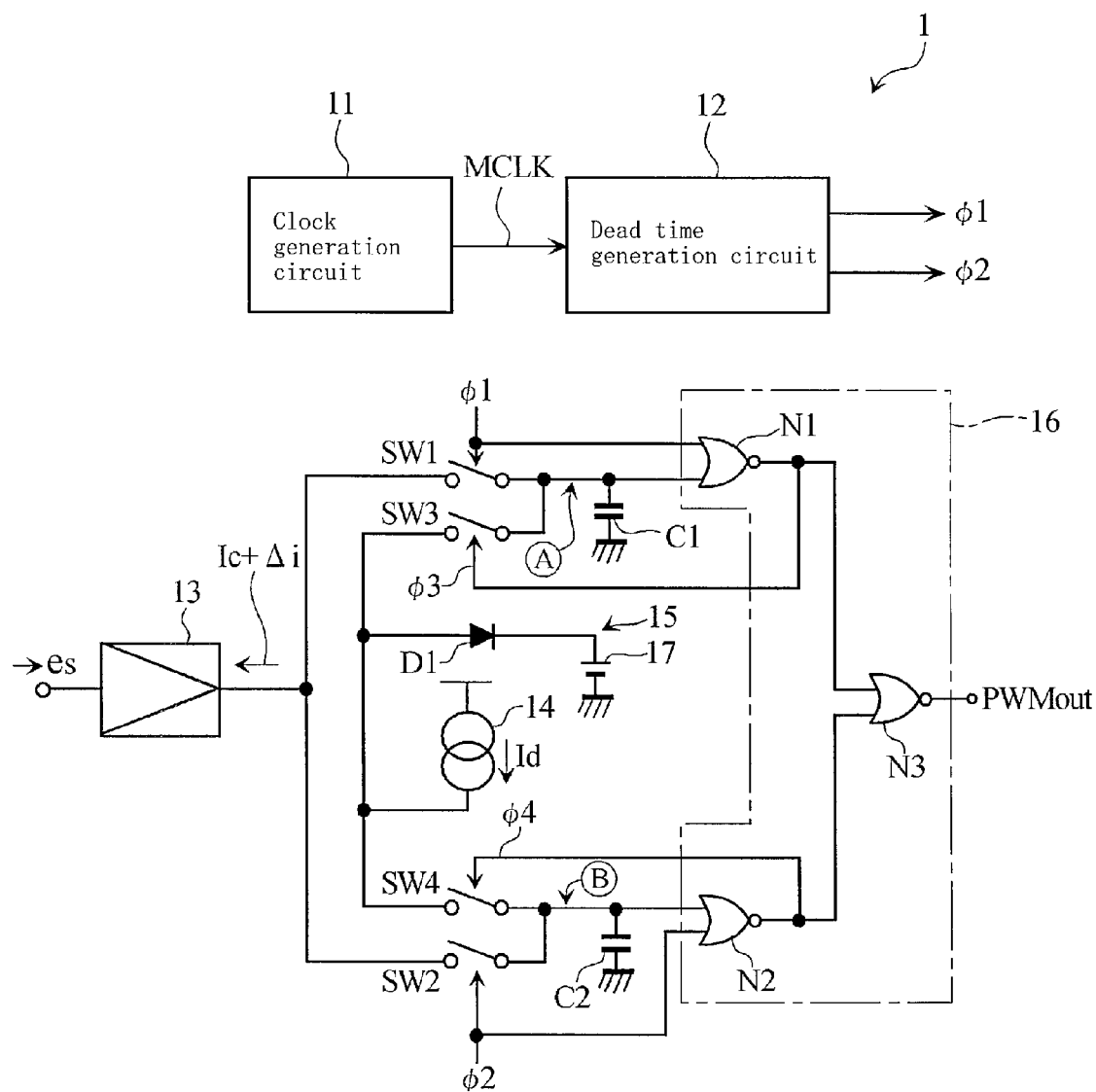
FIG. 2 is a block circuit diagram showing an example of the pulse width modulation circuit shown in FIG. 1.

FIG. 1 shows a configuration of a switching amplifier using a pulse width modulation (PWM) circuit according to a first embodiment of the present invention. FIG. 2 is a block circuit diagram showing an example of the pulse width modulation circuit shown in FIG. 1. The switching amplifier includes a pulse width modulation circuit 1 connected to an audio signal generation source AU, a switching circuit 2, a low-pass filter 3, and a first power source 4 and a second power source 5 for supplying positive and negative power source voltages +EB and −EB, respectively. A speaker (not shown) as a load RL is connected to the output of the low-pass filter 3.

The pulse width modulation circuit 1 is for performing a pulse width modulation on the audio signal eS as the input signal output from the audio signal generation source AU to generate and output a modulated signal PWMout. The modulated signal PWMout output from the pulse width modulation circuit 1 is input to the switching circuit 2.

In the switching circuit 2, positive and negative power source voltages +EB and −EB are supplied from the first power source 4 and the second power source 5, and the power source voltages +EB and −EB are alternately switched ON and OFF based on the modulated signal PWMout. Thus, the switching circuit 2 includes a switching element SW-A, which is turned ON and OFF based on the modulated signal PWMout, an inverter 2a for inverting the phase of the modulated signal PWMout output from the pulse width modulation circuit 1, a switching element SW-B, which is turned ON and OFF based on a modulated signal PWMout' that is obtained by inverting the modulated signal PWMout with the inverter 2a, and reverse current-preventing diodes D-A and D-B connected to opposite ends of the switching elements SW-A and SW-B, respectively.

The switching elements SW-A and SW-B are alternately turned ON and OFF by the modulated signal PWMout and the inverted modulated signal PWMout' to thereby supply the positive and negative power source voltages +EB and −EB, which are switched ON and OFF, to the low-pass filter 3 and the load RL.

The low-pass filter 3 is implemented by an LC circuit including a coil L0 and a condenser C0. The low-pass filter 3 supplies the output signal from the switching circuit 2 to the load RL after removing a high-frequency component thereof, and has a cut-off frequency of 60 kHz, for example. The low-pass filter 3 removes a high-frequency component of the positive and negative power source voltages +EB and −EB, which are switched ON and OFF, to thereby output the resultant signal to the load RL, which is then output from the load RL as a sound.

As shown in FIG. 2, the pulse width modulation circuit 1 includes a clock generation circuit 11, a dead time generation circuit 12, a voltage-current conversion circuit 13, first to fourth switches SW1 to SW4, first and second integration circuits C1 and C2, a discharging bias current source 14, a current bypass circuit 15, and a signal output circuit 16.

The clock generation circuit 11 is a circuit for generating the reference clock signal MCLK. The reference clock signal MCLK is a clock signal whose duty cycle is substantially 50%, and serves as a reference signal for the first and second switching signals $\phi1$ and $\phi2$ used for switching the first and second switches SW1 and SW2 ON and OFF. The clock generation circuit 11 outputs the reference clock signal MCLK to the dead time generation circuit 12. The clock generation circuit 11 may be provided outside the pulse width modulation circuit 1 so that the clock generation circuit 11 supplies the reference clock signal MCLK as an external clock signal to the pulse width modulation circuit 1.

The dead time generation circuit 12 is a circuit for generating the first switching signal $\phi1$ and the second switching signal $\phi2$, which is in opposite phase to the first switching signal $\phi1$, based on the reference clock signal MCLK from the clock generation circuit 11. More specifically, the dead time generation circuit 12 is a circuit for delaying the transitions of the first and second switching signals $\phi1$ and $\phi2$ by a predetermined amount of time so that the output levels of the first and second switching signals $\phi1$ and $\phi2$ will not be both at the high level or both at the low level at the same time.

Figure 3:
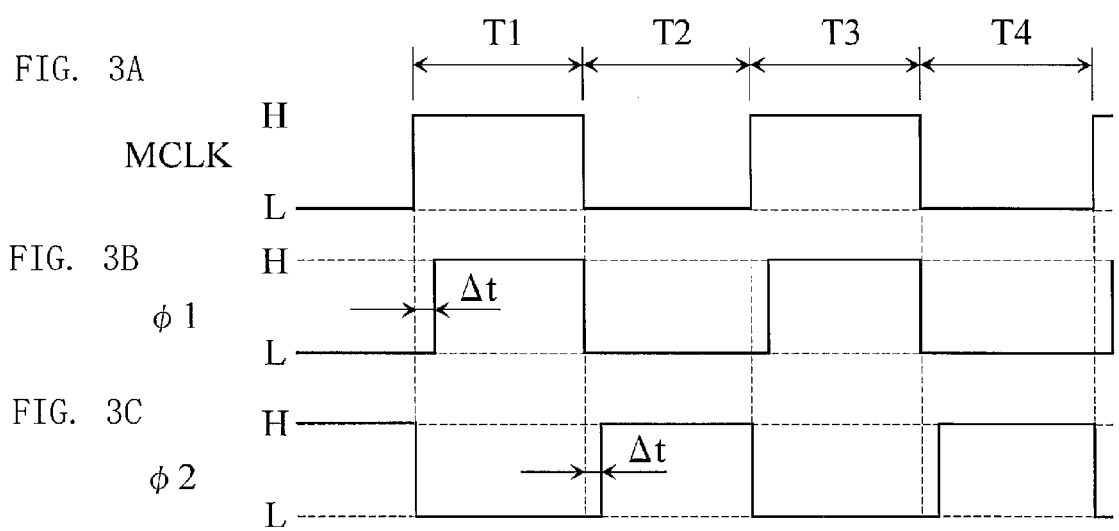
FIGS. 3A to 3C show the relationship between the reference clock signal and first and second switching signals.

Specifically, referring to FIGS. 3A and 3B, the first switching signal $\phi1$ transitions from low to high with a delay of a predetermined period $\Delta t$ from the low-to-high transition of the reference clock signal MCLK. The first switching signal $\phi1$ transitions from high to low simultaneously with the high-to-low transition of the reference clock signal MCLK. Referring to FIGS. 3A and 3C, the second switching signal $\phi2$ transitions from low to high with a delay of a predetermined period $\Delta t$ from the high-to-low transition of the reference clock signal MCLK. The second switching signal $\phi2$ transitions from high to low simultaneously with the low-to-high transition of the reference clock signal MCLK.

Therefore, where the first and second switches SW1 and SW2 are turned ON by the first and second switching signals $\phi1$ and $\phi2$, respectively, the first and second switches SW1 and SW2 are prevented from being ON simultaneously, thus preventing an error occurring in the output of the PWM signal PWMout, which would otherwise occur if the first and second integration circuits C1 and C2 are charged at the same time. The first and second switching signals $\phi1$ and $\phi2$ are output to the first and second switches SW1 and SW2, respectively.

For the purpose of illustration, the period in which the reference clock signal MCLK first transitions to the high level will hereinafter be referred to as the first period T1, the following low-level period as the second period T2, the following high-level period as the third period T3 and the following low-level period as the fourth period T4, as shown in FIG. 3A.

Referring back to FIG. 2, the voltage-current conversion circuit 13 is a circuit for performing a voltage-current conversion of the audio signal eS supplied from the audio signal generation source AU (see FIG. 1) to the pulse width modulation circuit 1. The voltage-current conversion circuit 13 includes a charging bias current source (not shown), and is a circuit for charging the first and second integration circuits C1 and C2 in the negative direction with respect to the reference voltage (e.g., the ground potential). As will be described later, the voltage-current conversion circuit 13 is connected to the first and second integration circuits C1 and C2 via the first and second switches SW1 and SW2, respectively, and draws in charges stored in the first and second integration circuits C1 and C2 to thereby charge the first and second integration circuits C1 and C2 in the negative direction.

Where Gm denotes the conversion conductance in the voltage-current conversion circuit 13, the current $\Delta i$ obtained by converting the audio signal eS through the voltage-current conversion circuit 13 can be represented as $\Delta i = Gm \cdot eS$. Where Ic denotes the charging bias current in the charging bias current source, the current drawn in from the first and second integration circuits C1 and C2 can be represented as Ic+Gm·eS=Ic+Δi.

The discharging bias current source 14 is a circuit for converting the supplied positive power source voltage +V to a discharging bias current Id. As will be described later, the discharging bias current source 14 is connected to the first and second integration circuits C1 and C2 via third and fourth switches SW3 and SW4, respectively, and supplies the discharging bias current Id to the first and second integration circuits C1 and C2 to thereby discharge the first and second integration circuits C1 and C2 in the positive direction.

The current bypass circuit 15 includes a diode D1 and a voltage source 17. The current bypass circuit 15 is a circuit through which a discharge current Id from the discharging bias current source 14 flows when the first and second integration circuits C1 and C2 are not being charged in the negative direction by the voltage-current conversion circuit 13 or discharged in the positive direction by the discharging bias current source 14. Note that the voltage of the voltage source 17 is set to be lower than the power source voltage of the discharging bias current source 14.

The first and second switches SW1 and SW2 are circuits that are turned ON and OFF for allowing the current Ic+Δi to flow from the first and second integration circuits C1 and C2 to the voltage-current conversion circuit 13 to thereby charge the first and second integration circuits C1 and C2 in the negative direction. The first and second switches SW1 and SW2 are turned ON and OFF based on the first and second switching signals φ1 and φ2 output from the dead time generation circuit 12. Thus, referring to FIG. 3B, the first switch SW1 is ON when the first switching signal φ1 is at the high level and OFF when the first switching signal φ1 is at the low level. Referring to FIG. 3C, the second switch SW2 is ON when the second switching signal φ2 is at the high level and OFF when the second switching signal φ2 is at the low level.

The third and fourth switches SW3 and SW4 are circuits that are turned ON and OFF for discharging in the positive direction the charge, which has been stored in the negative direction in the first and second integration circuits C1 and C2 by the discharging bias current Id supplied from the discharging bias current source 14. The third and fourth switches SW3 and SW4 are turned ON and OFF based on control signals φ3 and φ4 from the signal output circuit 16. Specifically, the third switch SW3 is ON when the control signal φ3 is at the high level and OFF when the control signal φ3 is at the low level. The fourth switch SW4 is ON when the control signal φ4 is at the high level and OFF when the control signal φ4 is at the low level. The control signals φ3 and φ4 are output from first and second NOR circuits N1 and N2 of the signal output circuit 16 to be described later.

The first and second integration circuits C1 and C2 are each implemented by a charge condenser, and are each a circuit that is charged by storing a predetermined charge and discharged by releasing the charge.

Specifically, in the first period T1 (strictly speaking, the period excludes the predetermined period Δt being a dead time), as the first switch SW1 is turned ON (the third switch SW3 is turned OFF), the charge stored in the first integration circuit C1 flows to the voltage-current conversion circuit 13, whereby the first integration circuit C1 is charged in the negative direction. In the following second period T2, as the third switch SW3 is turned ON (the first switch SW1 is turned OFF), the first integration circuit C1 is discharged in the positive direction by the discharging bias current Id from the discharging bias current source 14.

In the second period T2 (strictly speaking, the period excludes the predetermined period Δt being a dead time) during which the first integration circuit C1 is discharged in the positive direction, as the second switch SW2 is turned ON (the fourth switch SW4 is turned OFF), the charge stored in the second integration circuit C2 flows to the voltage-current conversion circuit 13, whereby the second integration circuit C2 is charged in the negative direction. In the following third period T3, as the fourth switch SW4 is turned ON (the second switch SW2 is turned OFF), the second integration circuit C2 is discharged in the positive direction by the discharging bias current Id from the discharging bias current source 14.

Thus, the first and second integration circuits C1 and C2 are alternately charged and discharged in unit periods (e.g., the first period T1 or the second period T2), in each of which the levels of the first and second switching signals φ1 and φ2 are kept constant.

The circuit configuration related to the charging/discharging of the first and second integration circuits C1 and C2 will now be described. The first ends of the first and second switches SW1 and SW2 are connected to the voltage-current conversion circuit 13, and the second end of the first switch SW1 is connected to the first end of the first integration circuit C1 (see the point A in FIG. 2), thus forming a path for charging the first integration circuit C1 in the negative direction. The second end of the first integration circuit C1 is connected to the ground potential. The first end of the first integration circuit C1 is connected also to the first end of the third switch SW3, and the second end of the third switch SW3 is connected to the discharging bias current source 14, thus forming a path for discharging the first integration circuit C1 in the positive direction.

The second end of the second switch SW2 is connected to the first end of the second integration circuit C2 (see the point B in FIG. 2), thus forming a path for charging the second integration circuit C2 in the negative direction. The second end of the second integration circuit C2 is connected to the ground potential. The first end of the second integration circuit C2 is connected also to the first end of the fourth switch SW4, and the second end of the fourth switch SW4 is connected to the discharging bias current source 14, thus forming a path for discharging the second integration circuit C2 in the positive direction.

As shown in FIG. 2, the signal output circuit 16 is implemented by a logic circuit being a combination of a plurality of logic elements, including, for example, first to third NOR circuits N1, N2 and N3. The first NOR circuit N1 has its first input terminal connected to the output terminal of the first switching signal φ1 of the dead time generation circuit 12 and its second input terminal connected to the first end of the first integration circuit C1. The second NOR circuit N2 has its first input terminal connected to the output terminal of the second switching signal φ2 of the dead time generation circuit 12 and its second input terminal connected to the first end of the second integration circuit C2.

The output terminal of the first NOR circuit N1 is connected to the first input terminal of the third NOR circuit N3 and is also connected to the third switch SW3. The output terminal of the second NOR circuit N2 is connected to the second input terminal of the third NOR circuit N3 and is also connected to the fourth switch SW4. The output terminal of the third NOR circuit N3, as the PWM signal PWMout, is connected to the switching circuit 2 (see FIG. 1) downstream.

The first NOR circuit N1 outputs a high-level signal based on the NOR between the first switching signal φ1 and the terminal voltage of the first integration circuit C1, i.e., if the first switching signal φ1 is at the low level and the terminal voltage of the first integration circuit C1 is less than a predetermined voltage Vth (e.g., 2.5 V). The second NOR circuit N2 outputs a high-level signal based on the NOR between the second switching signal φ2 and the terminal voltage of the second integration circuit C2, i.e., if the second switching signal φ2 is at the low level and the terminal voltage of the second integration circuit C2 is less than the predetermined voltage Vth.

The third NOR circuit N3 calculates the NOR between the outputs of the first and second NOR circuits N1 and N2 so as to convert the outputs from the first and second NOR circuits N1 and N2 into a single PWM signal PWMout, which is output to the switching circuit 2.

Thus, as the signal output circuit 16 is implemented by a single gate device, an IC having a plurality of single gate devices can be used as the signal output circuit 16, for example, thereby contributing to the reduction in the size of the circuit.

Figure 4:
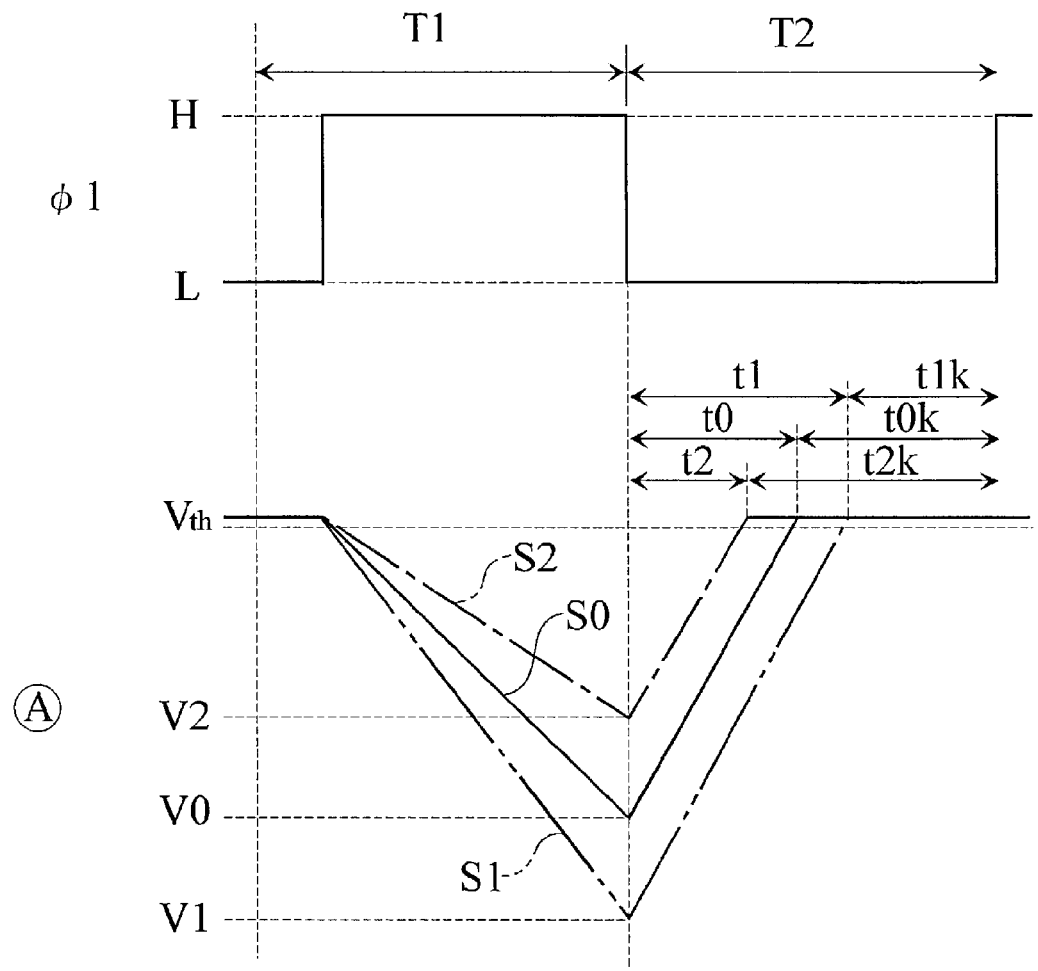
FIG. 4 shows the relationship between the transitions of the first switching signal and the voltage waveform at a first end of the first integration circuit.

FIG. 4 shows the relationship between the transitions of the first switching signal φ1 and the voltage waveform at the first end of the first integration circuit C1 (see the point A in FIG. 2).

As the first switching signal φ1 goes high, the first switch SW1 is turned ON, whereby the first integration circuit C1 is charged in the negative direction. The gradient of the voltage waveform (the voltage at the point A in FIG. 2) during the charge period is dependent on the magnitude of the current (Ic+Δi) (where Δi=G·eS), i.e., the positive-negative direction of the audio signal eS and the amplitude thereof.

In FIG. 4, S0 denotes the voltage waveform where the audio signal eS is absent, S1 denotes the voltage waveform where the audio signal eS is positive and the amplitude thereof is relatively large, and S2 denotes the voltage waveform where the audio signal eS is negative and the amplitude thereof is relatively large.

Referring to FIG. 4, the voltage waveform S1 where the audio signal eS is positive and the amplitude thereof is relatively large has a gradient greater than that of the voltage waveform S0 where the audio signal eS is absent. The voltage waveform S2 where the audio signal eS is negative and the amplitude thereof is relatively large has a gradient smaller than that of the voltage waveform S0 where the audio signal eS is absent.

Thus, as the first integration circuit C1 is charged in the negative direction, the voltage of the first integration circuit C1 takes the smallest value when the level of the first switching signal φ1 flips. For example, when the audio signal eS is absent, the lowest charge voltage is V0 as shown in FIG. 4. Where the audio signal eS is positive and the amplitude thereof is relatively large, the lowest charge voltage is V1 (<V0). Where the audio signal eS is negative and the amplitude thereof is relatively large, the lowest charge voltage is V2 (>V0).

The charge of the first integration circuit C1 in the negative direction continues until the level of the first switching signal φ1 flips, and the first switch SW1 is turned OFF when the first switching signal φ1 flips to the low level. Since the level of the first switching signal φ1 and the voltage level at the point A of the first integration circuit C1 are input to the input terminal of the first NOR circuit N1 of the signal output circuit 16, the output terminal of the first NOR circuit N1 transitions to the high level simultaneously with the flipping of the first switching signal φ1 to the low level. The signal at the output terminal of the first NOR circuit N1 is output as the control signal φ3 to the third switch SW3, whereby the third switch SW3 is turned ON.

Since the point A of the first integration circuit C1 is connected to the discharging bias current source 14, the first integration circuit C1 is discharged in the positive direction as the third switch SW3 is turned ON. The voltage waveform when the first integration circuit C1 is being discharged in the positive direction during the second period T2 has a constant gradient, irrespective of the positive-negative direction of the audio signal eS and the amplitude thereof, since the discharging bias current Id flowing into the first integration circuit C1 is always constant. Thus, as shown in FIG. 4, the gradient of the voltage waveform when the first integration circuit C1 is discharged in the positive direction is constant, irrespective of the gradient of the voltage waveform when the first integration circuit C1 is charged in the negative direction (the first period T1).

Specifically, while the first integration circuit C1 is charged in the negative direction during the first period T1, the amount of charge in the charge operation is dependent on the positive-negative direction of the audio signal eS and the amplitude thereof. While the first integration circuit C1 is discharged in the positive direction during the second period T2, the amount of discharge is made constant. Therefore, the amount of time from the start of the discharge of the first integration circuit C1 in the positive direction (i.e., since the transition to the second period T2) until the terminal voltage of the first integration circuit C1 reaches the threshold voltage Vth is dependent on the positive-negative direction of the audio signal eS and the amplitude thereof.

For example, where the audio signal eS is positive and the amplitude thereof is relatively large, the terminal voltage of the first integration circuit C1 at the start of the discharge in the positive direction is the lowest charge voltage V1. In such a case, the amount of time until the terminal voltage of the first integration circuit C1 reaches the threshold voltage Vth (see t1 in FIG. 4) is longer than that where the audio signal eS is absent (see t0 in FIG. 4). Conversely, where the audio signal eS is negative and the amplitude thereof is relatively large, the terminal voltage of the first integration circuit C1 at the start of the discharge in the positive direction is the lowest charge voltage V2. In such a case, the amount of time until the terminal voltage of the first integration circuit C1 reaches the threshold voltage Vth (see t2 in FIG. 4) is shorter than that where the audio signal eS is absent (see t0 in FIG. 4).

Therefore, with the pulse width modulation circuit 1 of the first embodiment, the amount of time t from the start of the discharge of the first integration circuit C1 in the positive direction until the terminal voltage of the first integration circuit C1 reaches the threshold voltage Vth is dependent on the positive-negative direction of the audio signal eS and the amplitude thereof, and the amount of time t from the start of the discharge of the second integration circuit C2 in the positive direction until the terminal voltage of the second integration circuit C2 reaches the threshold voltage Vth is also dependent on the positive-negative direction of the audio signal eS and the amplitude thereof, as is the terminal voltage of the first integration circuit C1. Therefore, the discharge time t of the first integration circuit C1 and that of the second integration circuit C2 are determined alternately for every cycle of the clock signal MCLK by means of the circuits from the clock generation circuit 11 to the current bypass circuit 15. The discharge times t are combined together to thereby produce the PWM signal PWMout, wherein the discharge times t correspond to the OFF periods of the PWM signal PWMout.

Where it is assumed that the capacitances of the first and second integration circuits C1 and C2 are equal to each other (=C) and the period being the charging time of the first and second integration circuits C1 and C2 is T (corresponding for example to the first period T1), the lowest charge voltage Vc (the potential difference between the start of the charge in the negative direction and the end of the charging) can be represented as $Vc=[(Ic+\Delta i)\cdot T]/C$.

As the amount of time t from the start of the discharge of the first integration circuit C1 (or the second integration circuit C2) in the positive direction until the voltage of the first integration circuit C1 (or the second integration circuit C2) reaches the threshold voltage Vth is $t=C\cdot Vc/Ib$, $t=[(Ic+\Delta i)\cdot T]/Id$. Substituting $\Delta i=Gm\cdot eS$ into the expression yields $t=(Gm\cdot T/Id)\cdot eS+Ic\cdot T/Id$. Thus, the amount of time t changes in proportion to the audio signal eS.

Since the degree of modulation m in the pulse width modulation circuit 1 is $m=t/T-(T-t)/T$, $m=2\Delta i/Id+2Ic/Id-1$ holds in view of the modified expression $t=[(Ic+\Delta i)\cdot T]/Id$. If the discharging bias current Id is set to be twice as high as the charging bias current Ic (Id=2Ic), the degree of modulation m is $m=\Delta i/Ic=(Gm/Ic)\cdot eS$. Thus, the degree of modulation m is dependent on the audio signal eS. The discharging bias current Id is set to be twice as high as the charging bias current Ic because the proportional relationship between the degree of modulation m and the audio signal eS then becomes clear and it is possible to suppress the occurrence of offsets.

In the second period T2, the discharge of the first integration circuit C1 continues with a constant voltage waveform gradient, and when the voltage at the point A of the first integration circuit C1 reaches the threshold voltage Vth, the output of the first NOR circuit N1 goes low and the third switch SW3 is turned OFF. Thus, the discharge of the first integration circuit C1 in the positive direction ends.

When the third switch SW3 is turned OFF, the voltage-current conversion circuit 13, which is provided for charging the first integration circuit C1, and the discharging bias current source 14, which is provided for discharging the first integration circuit C1, are not connected to the first end of the first integration circuit C1, and the terminal voltage of the first integration circuit C1 is kept at the threshold voltage Vth until the next charge operation is performed on the first integration circuit C1. Specifically, referring to FIG. 4, where the audio signal eS is absent, the terminal voltage of the first integration circuit C1 is kept at the threshold voltage Vth over a period of time t0$k$ from the end of the discharge in the positive direction until the start of the next charging. Where the audio signal eS is positive and the amplitude thereof is relatively large, the voltage is kept at the threshold voltage Vth over a period of time t1$k$ (<t0$k$). Where the audio signal eS is negative and the amplitude thereof is relatively large, the voltage is kept at the threshold voltage Vth over a period of time t2$k$ (>t0$k$).

Thus, in the present embodiment, the voltage information based on the audio signal eS is converted to time information, which is associated with the OFF periods of a pulse signal, thus appropriately producing pulse widths of the PWM signal PWMout. Therefore, even when the pulse width modulation circuit 1 is used in a multi-channel switching amplifier, for example, the pulse width modulation circuit 1 can perform a pulse width modulation in synchronism with the first and second switching signals φ1 and φ2. Since the same sets of the first and second switching signals φ1 and φ2 can be used for different channels, the carrier frequency f will not slightly vary among different channels when the audio signal eS is input. Thus, it is possible to suppress the mixing of a beat component between signals to be modulated (carriers) in the audio frequency component.

Figure 5A:
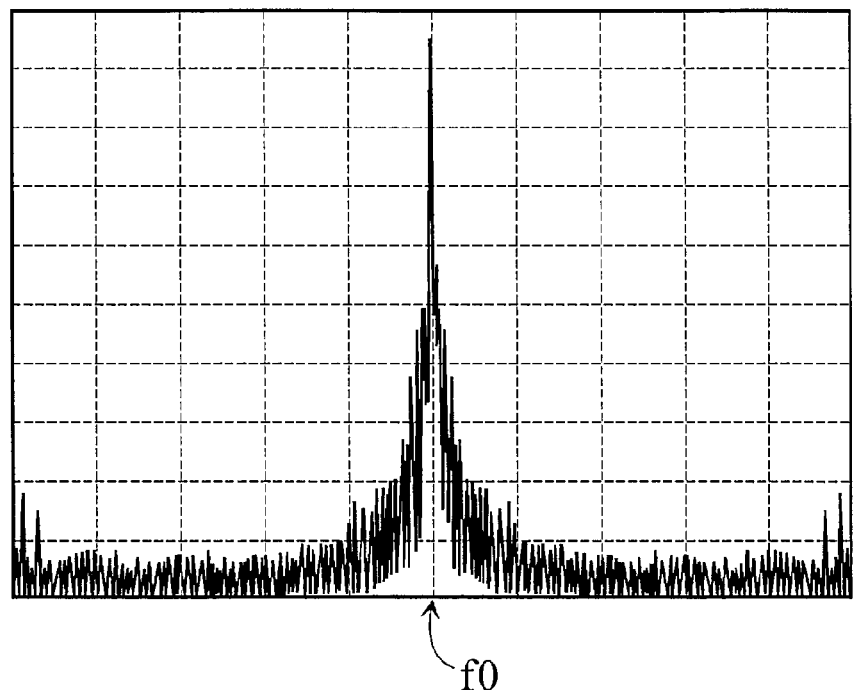
FIG. 5A shows the spectrum waveform of a carrier in the pulse width modulation circuit where the audio signal is absent.
Figure 5B:
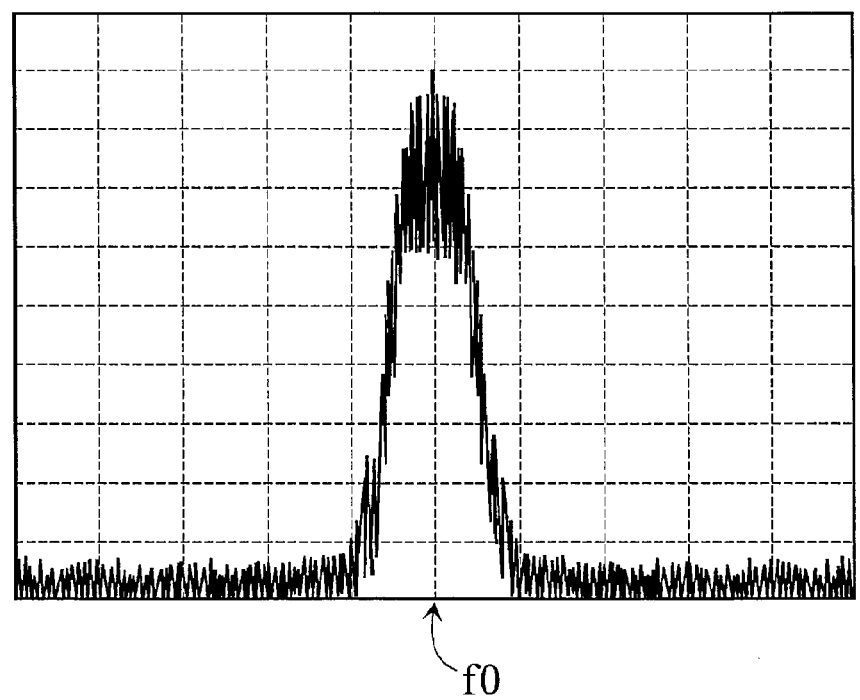
FIG. 5B shows the same during a modulation operation.

FIG. 5A shows the spectrum waveform of a carrier in the pulse width modulation circuit 1 of the present embodiment where the audio signal eS is absent, and FIG. 5B shows the same during a modulation operation. It can be seen from the figures that the carrier frequency f where the audio signal eS is absent is kept at a predetermined frequency f0, and the carrier frequency f is kept substantially at the predetermined frequency f0 also during a modulation operation.

Figures 21A, 21B:
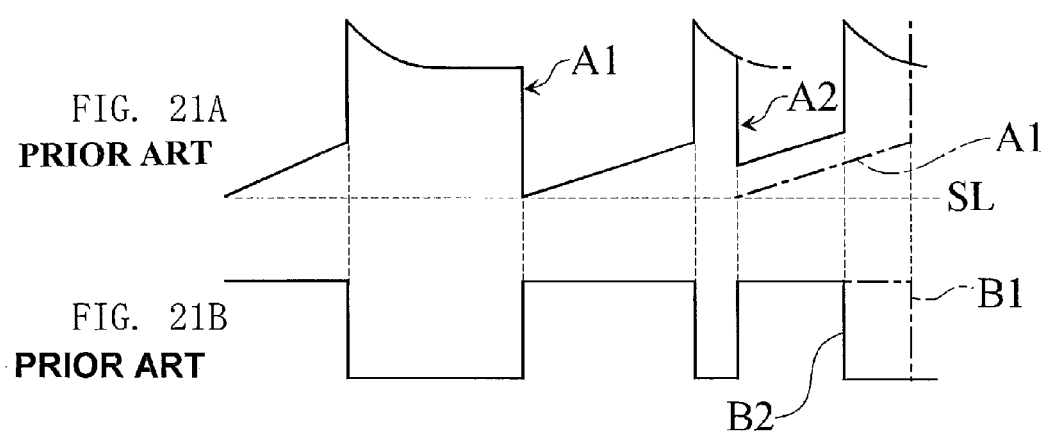
FIGS. 21A and 21B show the output waveform at the point a and that at the point b in the conventional pulse width modulation circuit.

With the conventional pulse width modulation circuit 51 (see FIG. 19), charges that have been stored in the first and second charge condensers C51 and C52 during a charge period need to be rapidly discharged to bring the charges in the first and second charge condensers C51 and C52 back to a predetermined amount (see the level SL of A1 in FIG. 21A) before starting to charge the first and second charge condensers C51 and C52 again. In contrast, with the pulse width modulation circuit 1 of the present embodiment, the voltages of the first and second integration circuits C1 and C2 are kept at the threshold voltage Vth after charging in the negative direction and discharging in the positive direction, whereby the rapid discharge is not needed.

Thus, it is possible to prevent the next charge from starting without sufficiently discharging the stored charge to thereby cause a conversion error when the audio signal eS is converted to a PWM signal, whereby a desirable sound quality can be obtained.

Referring to FIG. 4, when the first and second switches SW1 and SW2 are OFF, the terminal voltages of the first and second integration circuits C1 and C2 are slightly higher than the threshold voltage Vth. This is so because if the terminal voltage of the first integration circuit C1 is equal to the threshold voltage Vth, it will be difficult for the first and second NOR circuits N1 and N2 to identify the high level and the low level, thus making the operation unstable.

FIGS. 6A to 8H show timing diagrams of various signals in the pulse width modulation circuit 1. FIGS. 6A to 6H show timing diagrams where the audio signal eS is absent (Gm·eS=0), FIGS. 7A to 7H show timing diagrams where the audio signal eS is positive, and FIGS. 8A to 8H show timing diagrams where the audio signal eS is negative.

In the first period T1 in FIGS. 6A to 6H, the first switching signal φ1 from the dead time generation circuit 12 is at the high level (the second switching signal φ2 is at the low level) (see FIG. 6B), whereby the first switch SW1 is ON (the second switch SW2 is OFF). Therefore, the first integration circuit C1 is connected to the voltage-current conversion circuit 13, and a current (Ic+Δi) is drawn in by the voltage-current conversion circuit 13, whereby the first integration circuit C1 is charged in the negative direction (see FIG. 6F). The charging in the negative direction continues until the first switching signal φ1 flips from high to low, i.e., until the first switch SW1 is turned OFF.

When the first switching signal φ1 flips from high to low, the first switch SW1 is turned OFF, transitioning to the second period T2. In the second period T2, as the first switch SW1 is turned OFF, the output (the control signal φ3) of the first NOR circuit N1 of the signal output circuit 16 goes from low to high (see FIG. 6D). Thus, the third switch SW3 is turned ON, and the first end of the first integration circuit C1 is connected to the discharging bias current source 14, whereby the first integration circuit C1 is discharged in the positive direction at constant rate of discharge by the discharging current Id (see FIG. 6F).

In the second period T2, when the voltage produced by the discharge of the first integration circuit C1 in the positive direction reaches the threshold voltage Vth, the second input terminal of the first NOR circuit N1 transitions from low to high, whereby the output of the first NOR circuit N1 transitions from high to low. Thus, the third switch SW3 is turned OFF, and the first end of the first integration circuit C1 will be connected only to the second input terminal of the first NOR circuit N1. Therefore, the first end of the first integration circuit C1 is kept at the threshold voltage Vth. At this point, the discharging bias current source 14 is connected to the voltage source 17 via the diode D1, and the discharging current Id is allowed to flow to the voltage source 17.

Moreover, the output terminals of the first NOR circuit N1 and the second NOR circuit N2 are connected to the input terminal of the third NOR circuit N3 of the signal output circuit 16. Therefore, as the output of the first NOR circuit N1 (the control signal $\phi3$) goes low, the output of the third NOR circuit N3 goes high since the output of the second NOR circuit N2 (the control signal $\phi4$) is at the low level, and this is output to the switching circuit 2 as the PWM signal PWMout (see FIG. 6H).

In the second period T2, the second switching signal $\phi2$ from the dead time generation circuit 12 is at the high level (see FIG. 6C), the second switch SW2 is ON. Therefore, as the current (Ic+$\Delta$i) is drawn into the voltage-current conversion circuit 13, the second integration circuit C2 is charged in the negative direction by the voltage-current conversion circuit 13 (see FIG. 6G).

Then, in the third period T3, the first switching signal $\phi1$ goes from low to high, whereby the first switch SW1 is turned ON. Therefore, as the current (Ic+$\Delta$i) is drawn into the voltage-current conversion circuit 13, the first integration circuit C1 is charged in the negative direction (see FIG. 6F).

In the third period T3, the second switch SW2 is OFF and the fourth switch SW4 is ON, whereby the second integration circuit C2 is discharged in the positive direction at a constant rate of discharge (see FIG. 6G). When the voltage produced by the discharge of the second integration circuit C2 in the positive direction reaches the threshold voltage Vth, the second input terminal of the second NOR circuit N2 transitions from low to high, whereby the output of the first NOR circuit N1 transitions from high to low. Thus, the fourth switch SW4 is turned OFF, and the first end of the second integration circuit C2 will be connected only to the second input terminal of the second NOR circuit N2, and the first end of the second integration circuit C2 is kept at the threshold voltage Vth.

When the output of the second NOR circuit N2 (the control signal $\phi4$) goes low, the output of the third NOR circuit N3 goes high, which is output to the switching circuit 2 as the PWM signal PWMout (see FIG. 6H).

Then, in the fourth period T4, the first and second switching signals $\phi1$ and $\phi2$ are each inverted, whereby the second integration circuit C2 is charged in the negative direction and the first integration circuit C1 is discharged in the positive direction. Thereafter, the first and second switching signals $\phi1$ and $\phi2$ are each inverted every half a cycle, whereby the first and second integration circuits C1 and C2 are alternately charged and discharged.

Referring to FIGS. 7A to 7H, where the audio signal eS is positive, the current (Ic+$\Delta$i) is large, and the gradient of the voltage waveform at the first end of the first or second integration circuit C1 or C2 (the point A or the point B) is larger than that where the audio signal eS is absent. Therefore, the terminal voltage of the first or second integration circuit C1 or C2 at the time when the level of the first or second switching signal $\phi1$ or $\phi2$ flips is smaller than that where the audio signal eS is absent, and when they are discharged in the positive direction, the amount of time t from the start of the discharge until the voltage reaches the threshold voltage Vth is longer than that where the audio signal eS is absent. Therefore, the PWM signal PWMout with shorter high-level periods is output as shown in FIG. 7H, as compared with that where the audio signal eS is absent as shown in FIGS. 6A to 6H. Thus, it is possible to output the PWM signal PWMout according to the amplitude of the audio signal eS.

Referring to FIGS. 8A to 8H, where the audio signal eS is negative, the current (Ic+$\Delta$i) is small, and the gradient of the voltage waveform at the first end of the first or second integration circuit C1 or C2 is smaller than that where the audio signal eS is absent. Therefore, the terminal voltage of the first or second integration circuit C1 or C2 at the time when the level of the first or second switching signal $\phi1$ or $\phi2$ flips is larger than that where the audio signal eS is absent, and when they are discharged in the positive direction, the amount of time t from the start of the discharge until the voltage reaches the threshold voltage Vth is shorter than that where the audio signal eS is absent. Therefore, the PWM signal PWMout with longer high-level periods is output as shown in FIG. 8H, as compared with that where the audio signal eS is absent as shown in FIGS. 6A to 6H.

Second Embodiment

Figure 9:
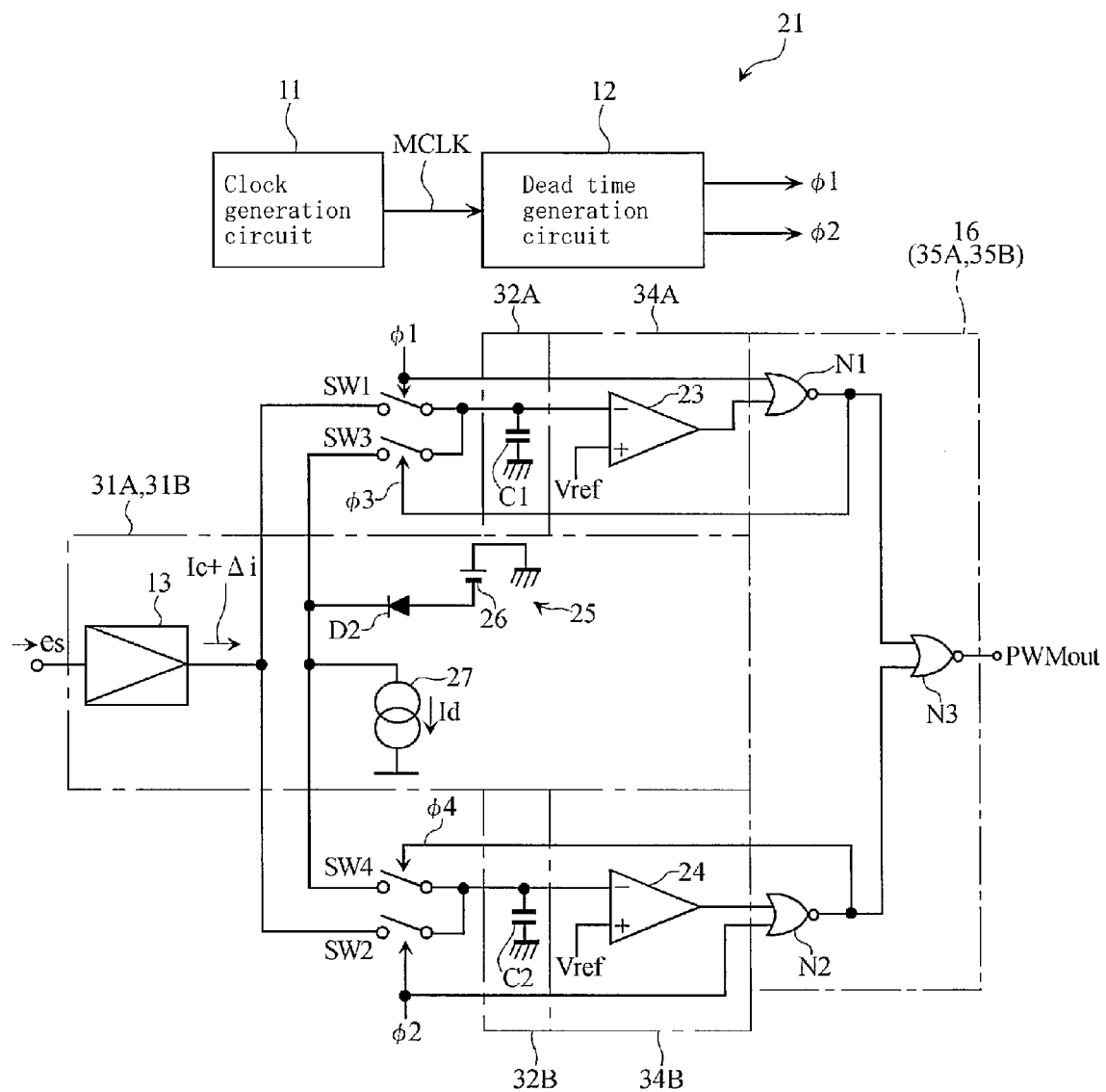
FIG. 9 is a block circuit diagram showing a pulse width modulation circuit according to a second embodiment of the present invention.

FIG. 9 is a block circuit diagram showing a configuration of a pulse width modulation circuit according to a second embodiment of the present invention. A pulse width modulation circuit 21 of the second embodiment differs from that of the first embodiment in that a first comparison circuit 23 and a second comparison circuit 24 are provided and in that a current bypass circuit 25 is provided instead of the current bypass circuit 15. Otherwise, the configuration is substantially the same as that of the first embodiment, and in FIG. 9, like elements to those of the pulse width modulation circuit 1 of the first embodiment shown in FIG. 2 are denoted by like reference numerals.

More specifically, the first and second comparison circuits 23 and 24 are connected to the first ends of the first and second integration circuits C1 and C2, respectively. The first and second comparison circuits 23 and 24 are implemented by operational amplifiers, for example, and are circuits for accurately detecting end of the discharge of the first and second integration circuits C1 and C2 by comparing the terminal voltages of the first and second integration circuits C1 and C2 with a predetermined reference voltage Vref (e.g., the ground potential). The first and second comparison circuits 23 and 24 may be implemented by CMOS logic ICs, for example, instead of operational amplifiers.

The first comparison circuit 23 has its negative-side (−) input terminal connected to the first end of the first integration circuit C1 and its positive-side (+) input terminal connected to the source of the reference voltage Vref. The second comparison circuit 24 has its negative-side (−) input terminal connected to the first end of the second integration circuit C2 and its positive-side (+) input terminal connected to the source of the reference voltage Vref. The output of the first comparison circuit 23 is input to the second input terminal of the first NOR circuit N1 of the signal output circuit 16. The output of the second comparison circuit 24 is input to the second input terminal of the second NOR circuit N2 of the signal output circuit 16.

The third switch SW3 and the fourth switch SW4 are provided with the current bypass circuit 25, including a diode D2 and a voltage source 26, for allowing the discharging current Id to flow to a discharging bias current source 27. The third switch SW3 and the fourth switch SW4 are provided also with the discharging bias current source 27 for discharging the first and second integration circuits C1 and C2.

With the pulse width modulation circuit 1 of the first embodiment, the first and second integration circuits C1 and C2 are once charged in the negative direction and then discharged in the positive direction. In contrast, with the pulse width modulation circuit 21 of the second embodiment, the first integration circuit C1 is charged in the positive direction in the first period T1 and discharged in the negative direction in the second period T2, after which it is kept at the reference voltage Vref. Therefore, the voltage waveforms of the first integration circuit C1 will be those obtained by inverting upside down the voltage waveforms S0, S1 and S2 shown in FIG. 4. The second integration circuit C2 is charged and discharged, as is the first integration circuit C1, except their operations are shifted from each other by half a cycle. Therefore, the pulse width modulation circuit 21 of the second embodiment is substantially different from the pulse width modulation circuit 1 of the first embodiment only in the voltage waveforms of the first and second integration circuits C1 and C2 during the charge/discharge operations, and the pulse width modulation circuit 21 can output a desirable PWM signal PWMout with a similar circuit operation to that of the pulse width modulation circuit 1.

Moreover, the pulse width modulation circuit 21 is provided with the first comparison circuit 23 and the second comparison circuit 24, and is also provided with an auxiliary reference line to be described later, whereby it is also possible to suppress problems such as separation, chattering, etc., to be described below.

Figure 10:
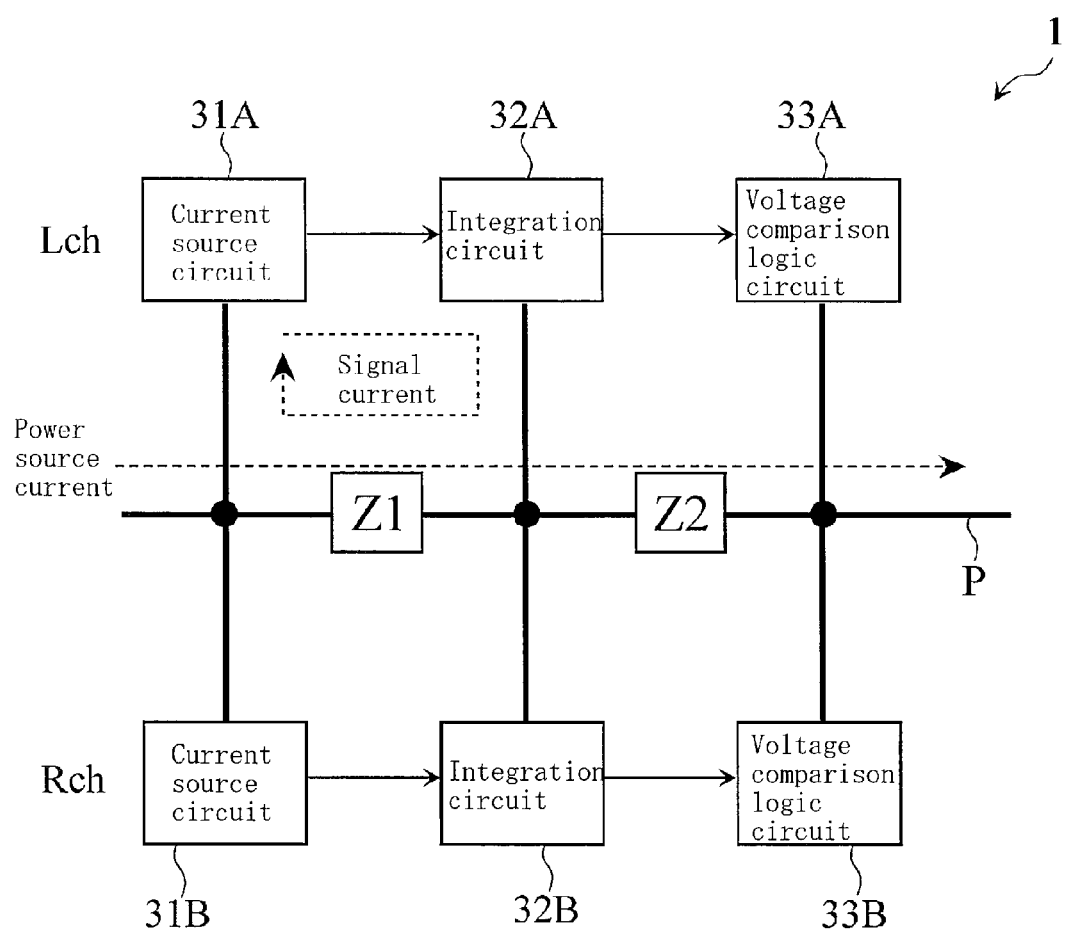
FIG. 10 is a block diagram showing a configuration of a conventional pulse width modulation circuit.

Specifically, the pulse width modulation circuit 1 of the first embodiment shown in FIG. 2 can be represented by a block configuration as shown in FIG. 10. Referring to FIG. 10, the pulse width modulation circuit 1 can be divided into current source circuit blocks 31A and 31B (including, for example, the voltage-current conversion circuit 13, the discharging bias current source 14 and the current bypass circuit 15), an integration circuit block 32A (including the first integration circuit C1), an integration circuit block 32B (including the second integration circuit C2), and voltage comparison logic circuit blocks 33A and 33B (including the clock generation circuit 11, the dead time generation circuit 12 and the signal output circuit 16).

The current source circuit block 31A, the integration circuit block 32A and the voltage comparison logic circuit block 33A are blocks for the left channel signal (see Lch in FIG. 10), and the current source circuit block 31B, the integration circuit block 32B and the voltage comparison logic circuit block 33B are blocks for the right channel signal (see Rch in FIG. 10).

While the pulse width modulation circuit 1 is placed on a printed circuit board (not shown), for example, the various blocks are connected to one another via the wiring pattern formed on the printed circuit board. Since the blocks 31A, 31B, 32A, 32B, 33A and 33B are connected to one another via the primary reference line P, being a part of the wiring pattern through which the power source current flows, the signal current flowing from the current source circuit block 31A to the integration circuit block 32A, for example, returns to the current source circuit block 31A via the primary reference line P. In such a case, the wiring impedance (see Z1 in FIG. 10) on the path along which the signal current flows through the primary reference line P causes a potential difference between the current source circuit block 31A and the integration circuit block 32A on the primary reference line P. This potential difference may deteriorate the separation between the right channel signal and the left channel signal.

While the power source current flows through the primary reference line P as shown in FIG. 10, the wiring impedance (see Z2 in FIG. 10) on the path along which the power source current flows through the primary reference line P causes a potential difference between the integration circuit block 32A and the voltage comparison logic circuit block 33A on the primary reference line P. Then, when a voltage comparison operation is performed by the first NOR circuit N1 or the second NOR circuit N2 (see FIG. 2) of the voltage comparison logic circuit block 33A, the variation of the potential difference influences the operation near the threshold voltage to thereby cause chattering.

Figure 11:
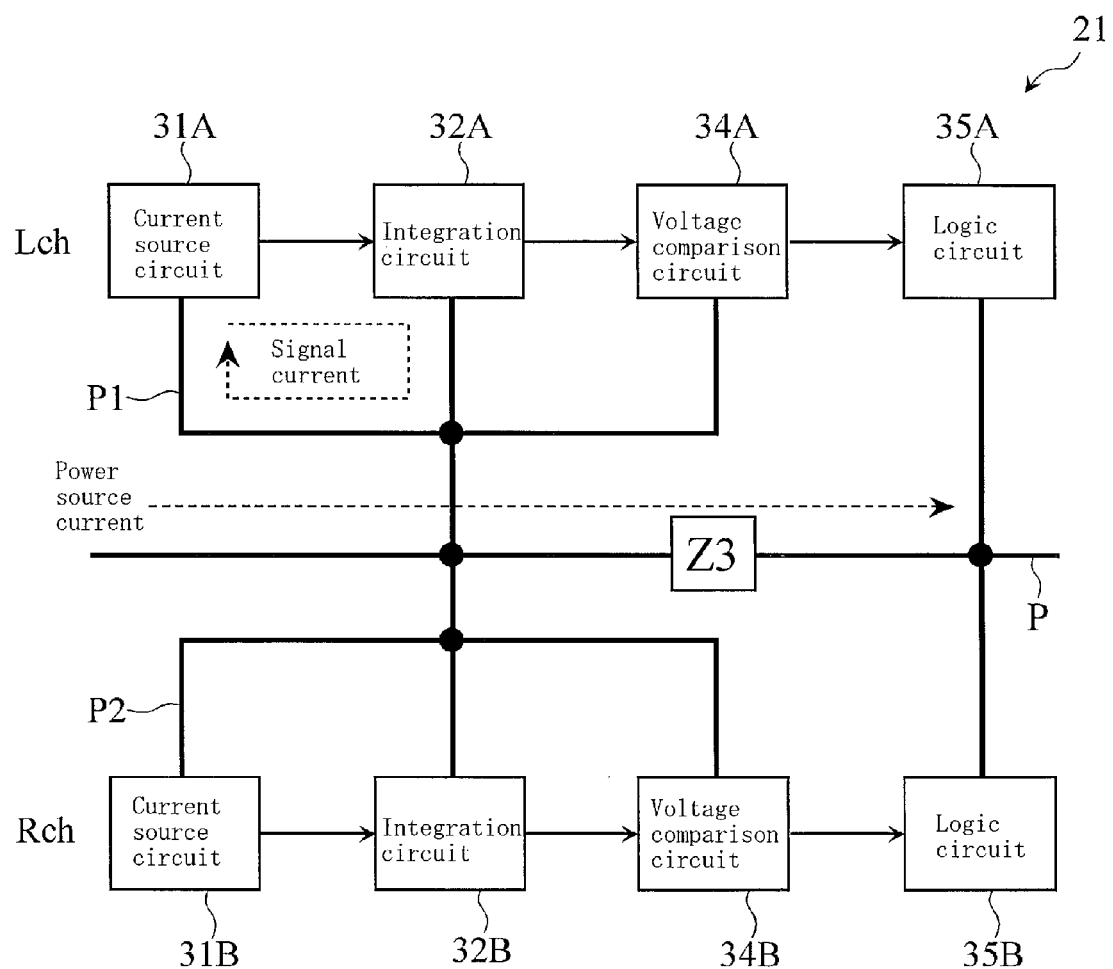
FIG. 11 is a block diagram showing a configuration of the pulse width modulation circuit according to the second embodiment of the present invention.

In view of this, the pulse width modulation circuit 21 of the second embodiment is divided into the current source circuit block 31A and 31B (including, for example, the voltage-current conversion circuit 13, the current bypass circuit 25 and the discharging bias current source 27), the integration circuit block 32A (including the first integration circuit C1), the integration circuit block 32B (including the second integration circuit C2), a voltage comparison circuit block 34A (including the first comparison circuit 23), a voltage comparison circuit block 34B (including the second comparison circuit 24), and logic circuit blocks 35A and 35B (including the clock generation circuit 11, the dead time generation circuit 12 and the signal output circuit 16), as shown in FIG. 11.

Thus, in the pulse width modulation circuit 21, the voltage comparison logic circuit block 33A shown in FIG. 10 is divided into the voltage comparison circuit block 34A (the first comparison circuit 23) and the logic circuit block 35A (the signal output circuit 16, etc.). Similarly, the voltage comparison logic circuit block 33B is divided into the voltage comparison circuit block 34B (the second comparison circuit 24) and the logic circuit block 35B (the signal output circuit 16, etc.).

Moreover, as shown in FIG. 11, the current source circuit block 31A, the integration circuit block 32A and the voltage comparison circuit block 34A are connected to one another via the auxiliary reference line P1, and the auxiliary reference line P1 is connected to the primary reference line P. Thus, the current source circuit block 31A, the integration circuit block 32A and the voltage comparison circuit block 34A are not connected directly to the primary reference line P, but are connected to the primary reference line P via the auxiliary reference line P1. On the other hand, the logic circuit block 35A is connected directly to the primary reference line P.

Similarly, the current source circuit block 31B, the integration circuit block 32B and the voltage comparison circuit block 34B are connected to one another via the auxiliary reference line P2, and the auxiliary reference line P2 is connected to the primary reference line P. Thus, the current source circuit block 31B, the integration circuit block 32B and the voltage comparison circuit block 34B are not connected directly to the primary reference line P, but are connected to the primary reference line P via the auxiliary reference line P2. On the other hand, the logic circuit block 35B is connected directly to the primary reference line P.

With such a configuration, the signal current flowing from the current source circuit block 31A to the integration circuit block 32A, for example, will not return to the current source circuit block 31A via the primary reference line P, but will return to the current source circuit block 31A via the auxiliary reference line P1 having a very small wiring impedance. Therefore, it is possible to suppress the problem of separation, which is caused by the potential difference occurring between the current source circuit block 31A and the integration circuit block 32A on the primary reference line P.

Similarly, the signal current flowing from the current source circuit block 31B to the integration circuit block 32B will return to the current source circuit block 31B via the auxiliary reference line P2 having a very small wiring impedance. Therefore, it is possible to suppress the problem of separation, which is caused by the potential difference occurring between the current source circuit block 31B and the integration circuit block 32B on the primary reference line P.

Moreover, the voltage comparison circuit block 34A is separated from the logic circuit block 35A and is connected to the integration circuit block 32A via the auxiliary reference line P1. Therefore, even if a potential difference occurs due to the wiring impedance (see Z3 in FIG. 11) on the primary reference line P between the voltage comparison circuit block 34A and the logic circuit block 35A, the voltage comparison circuit block 34A is unlikely to be influenced by the variation of the potential difference and the chattering can thus be suppressed, as the voltage comparison circuit block 34A is not connected directly to the primary reference line P.

Similarly, the voltage comparison circuit block 34B is separated from the logic circuit block 35B and is connected to the integration circuit block 32B via the auxiliary reference line P2. Therefore, the voltage comparison circuit block 34B is unlikely to be influenced by the variation of the potential difference and the chattering can thus be suppressed.

Third Embodiment

Figure 12:
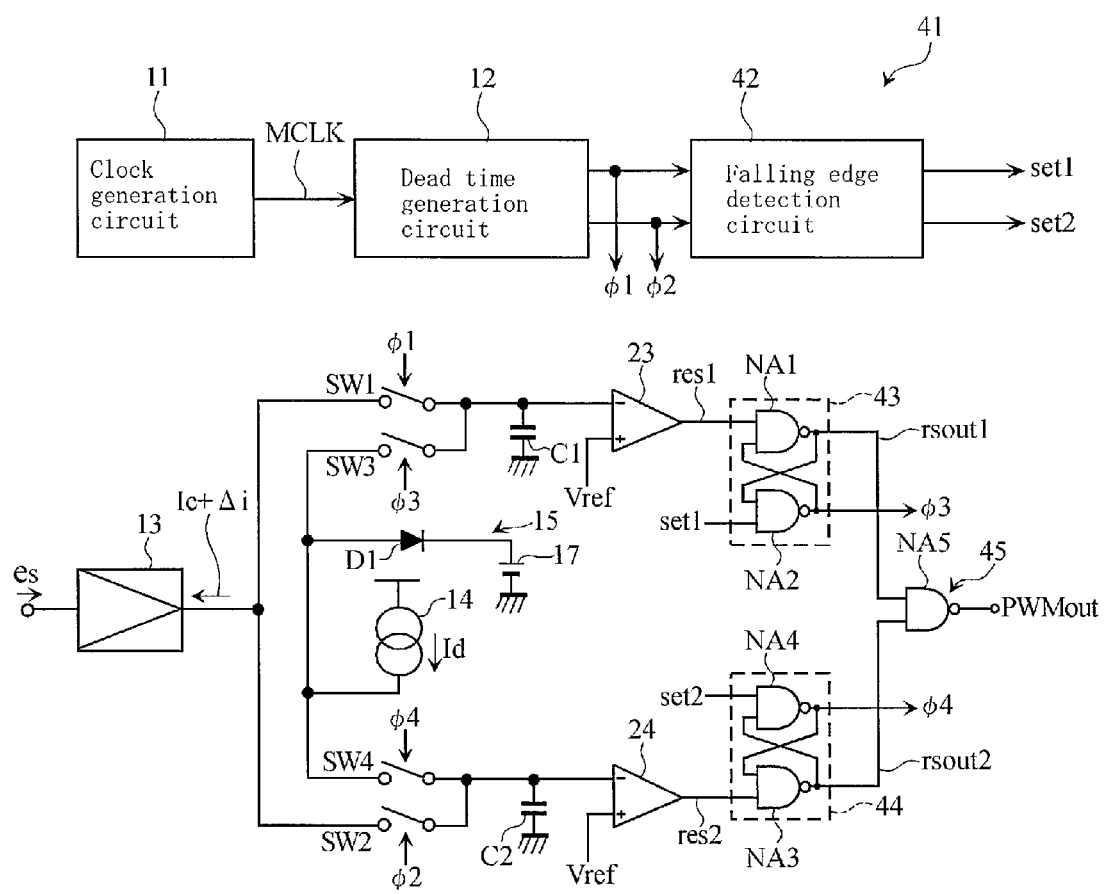
FIG. 12 is a block circuit diagram showing a pulse width modulation circuit according to a third embodiment of the present invention.

FIG. 12 is a block circuit diagram showing a configuration of a pulse width modulation circuit according to a third embodiment of the present invention. A pulse width modulation circuit 41 of the third embodiment differs from that of the first embodiment in that a falling edge detection circuit 42 is provided, the first ends of the first and second integration circuits C1 and C2 are connected to the first and second comparison circuits 23 and 24, respectively, and the outputs of the first and second comparison circuits 23 and 24 are connected to first and second RS flip flop circuits 43 and 44, respectively, for example. Otherwise, the configuration is substantially the same as the first embodiment, and in FIG. 12, like elements to those of the pulse width modulation circuit 1 of the first embodiment shown in FIG. 2 are denoted by like reference numerals.

In the pulse width modulation circuit 41, the falling edge detection circuit 42 is connected to the dead time generation circuit 12. The falling edge detection circuit 42 is a circuit for outputting the first and second set signals set1 and set2 to be output to the first and second RS flip flop circuits 43 and 44 to be described later. Specifically, the falling edge detection circuit 42 is a circuit for detecting the falling edge at which the first and second switching signals φ1 and φ2 from the dead time generation circuit 12 flip from high to low and then outputting the detected timings as the first and second set signals set1 and set2 to the first and second RS flip flop circuits 43 and 44.

As with the pulse width modulation circuit 21 of the second embodiment (see FIG. 9), the first and second comparison circuits 23 and 24 are connected to the first ends of the first and second integration circuits C1 and C2.

The first comparison circuit 23 has its negative-side (−) input terminal connected to the first end of the first integration circuit C1 and its positive-side (+) input terminal connected to the source of the reference voltage Vref. The second comparison circuit 24 has its negative-side (−) input terminal connected to the first end of the second integration circuit C2 and its positive-side (+) input terminal connected to the source of the reference voltage Vref. The output of the first comparison circuit 23 is input to the first RS flip flop circuit 43 as the first reset signal res1. The output of the second comparison circuit 24 is input to the second RS flip flop circuit 44 as the second reset signal res2.

The first and second RS flip flop circuits 43 and 44 are circuits for holding the outputs of the first and second comparison circuits 23 and 24, respectively, for a predetermined period of time. The first RS flip flop circuit 43 is implemented by a combination of first and second NAND circuits NA1 and NA2, wherein the output terminal of each of the first and second NAND circuits NA1 and NA2 is connected to the first input terminal of the other.

The second input terminal of the first NAND circuit NA1 is a terminal that is connected to the output terminal of the first comparison circuit 23 and that receives the first reset signal res1 as an RS flip flop, whereas the second input terminal of the second NAND circuit NA2 is a terminal that is connected to the falling edge detection circuit 42 and that receives the first set signal set1 as an RS flip flop. The output terminal of the second NAND circuit NA2 is connected to the third switch SW3. The switching of the third switch SW3 is controlled by the control signal φ3 output from the output terminal of the second NAND circuit NA2.

The second RS flip flop circuit 44 is implemented by a combination of third and fourth NAND circuits NA3 and NA4, wherein the output terminal of each of the third and fourth NAND circuits NA3 and NA4 is connected to the first input terminal of the other.

The second input terminal of the third NAND circuit NA3 is a terminal that is connected to the output terminal of the second comparison circuit 24 and that receives the second reset signal res2 as an RS flip flop, whereas the second input terminal of the fourth NAND circuit NA4 is a terminal that is connected to the falling edge detection circuit 42 and that receives the second set signal set2 as an RS flip flop. The output terminal of the fourth NAND circuit NA4 is connected to the fourth switch SW4. The switching of the fourth switch SW4 is controlled by the control signal φ4 output from the output terminal of the fourth NAND circuit NA4.

A signal output circuit 45 is implemented by a fifth NAND circuit NA5, and the output terminal of the first NAND circuit NA1 of the first RS flip flop circuit 43 and the output terminal of the third NAND circuit NA3 of the second RS flip flop circuit 44 are connected to the input terminals of the fifth NAND circuit NA5. The output signal rsout1 is output from the output terminal of the first NAND circuit NA1, and the output signal rsout2 is output from the output terminal of the third NAND circuit NA3. The PWM signal PWMout is output from the output terminal of the fifth NAND circuit NA5.

Also with the configuration of the second embodiment, it is possible to output a PWM signal PWMout similar to the PWM signal PWMout that is output with the configuration of the first embodiment shown in FIG. 2.

Figure 13:
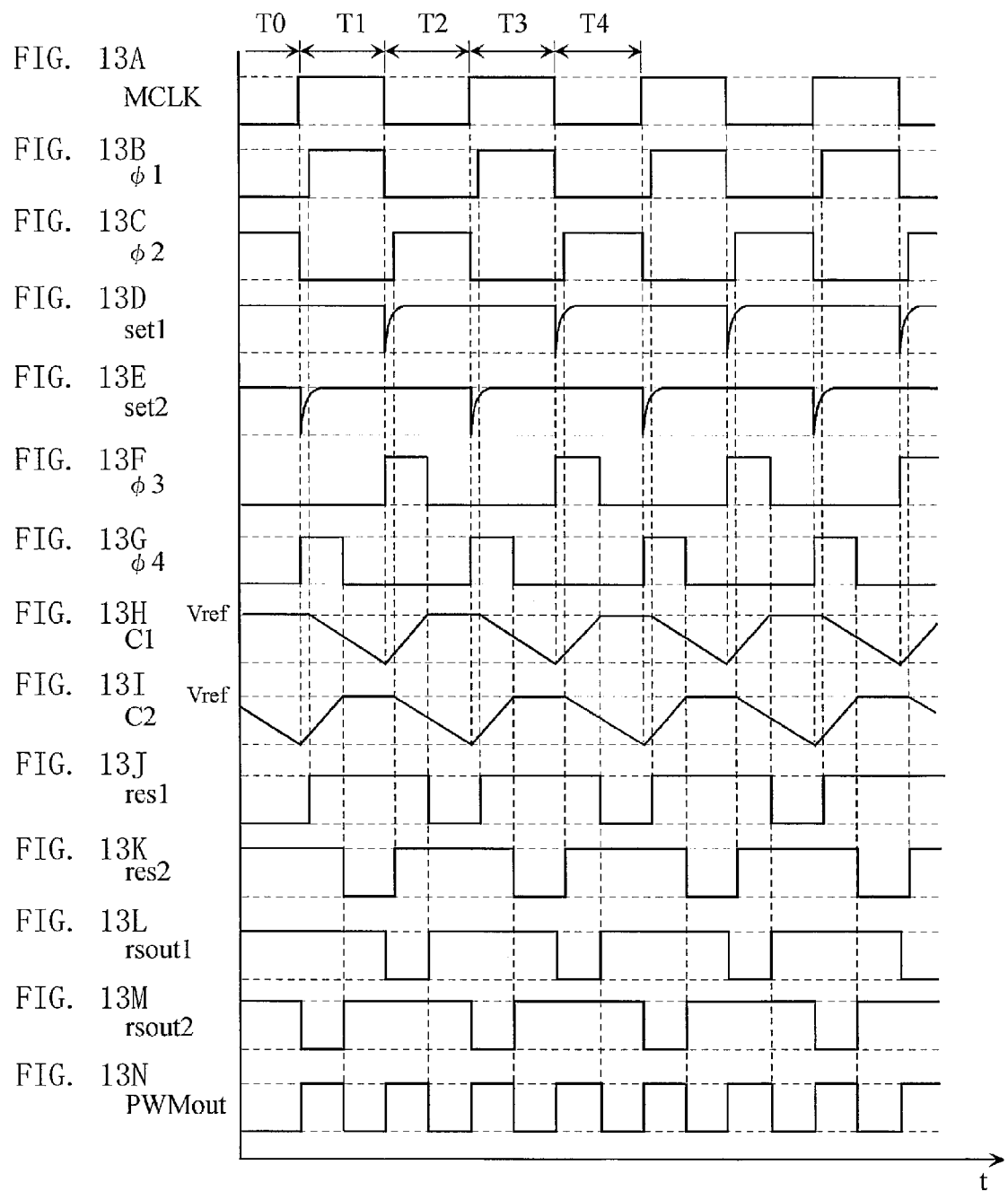
FIGS. 13A to 13N are timing diagrams showing the voltage waveforms of various signals where the audio signal is absent.
Figure 14:
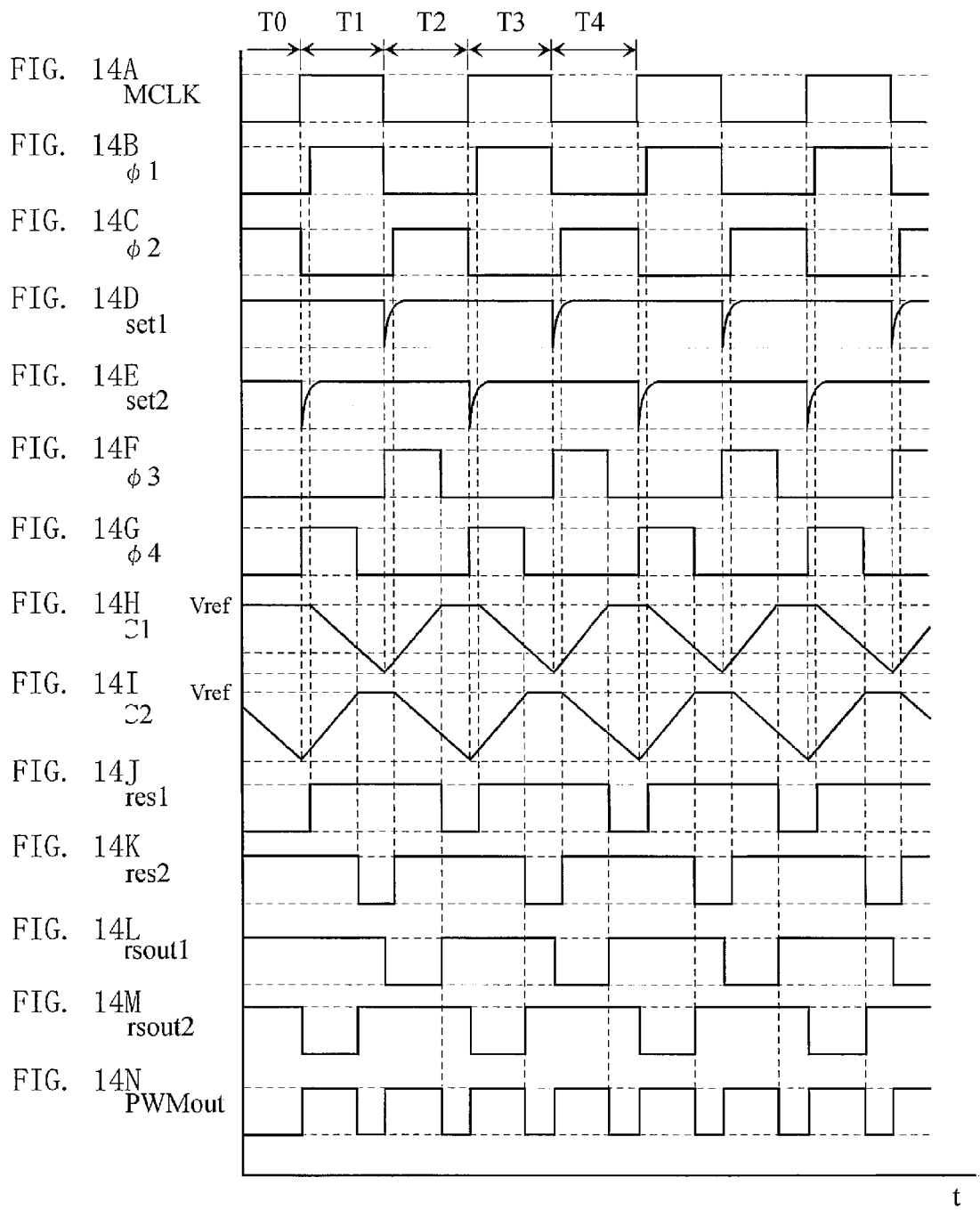
FIGS. 14A to 14N are timing diagrams showing the voltage waveforms of various signals where the audio signal is positive.
Figure 15:
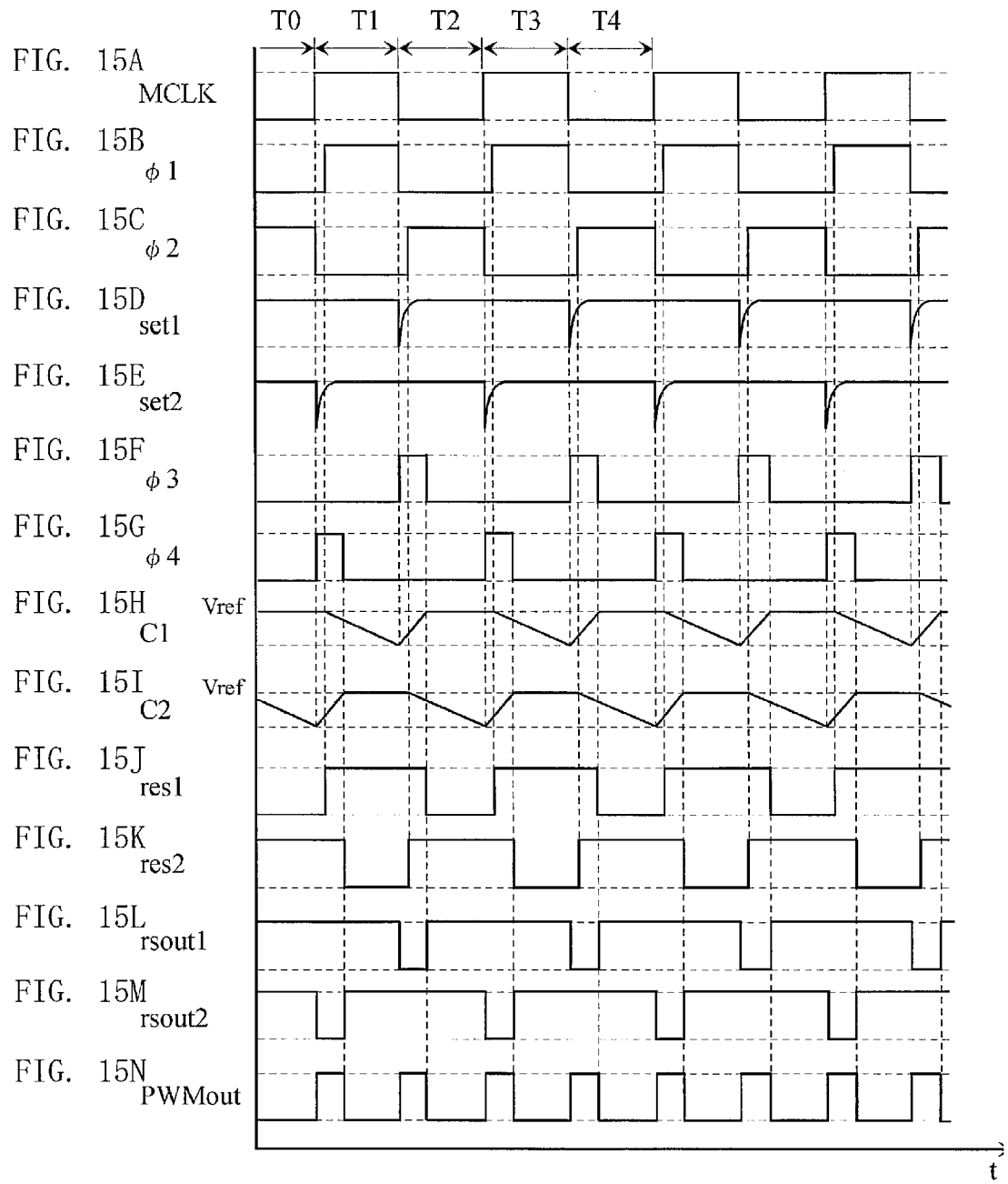
FIGS. 15A to 15N are timing diagrams showing the voltage waveforms of various signals where the audio signal is negative.

FIGS. 13A to 15N show timing diagrams of various signals in the pulse width modulation circuit 41. FIGS. 13A to 13N show timing diagrams where the audio signal eS is absent (Gm·eS=0), FIGS. 14A to 14N show timing diagrams where the audio signal eS is positive, and FIGS. 15A to 15N show timing diagrams where the audio signal eS is negative.

In the first period T1 in FIGS. 13A to 13N, the first switching signal φ1 from the dead time generation circuit 12 is at the high level (see FIG. 13B), whereby the first switch SW1 is ON. Therefore, the first integration circuit C1 is charged in the negative direction by the current (Ic+Δi) from the voltage-current conversion circuit 13 (see FIG. 13H).

When the first switching signal φ1 flips from high to low, the operation transitions to the second period T2, wherein the falling edge detection circuit 42 detects the fall of the first switching signal φ1, and outputs the detection result to the first RS flip flop circuit 43 as the first set signal set1 (see FIG. 13D).

When the first RS flip flop circuit 43 receives, as the first set signal set1, a signal that goes low instantaneously, the second NAND circuit NA2 flips its output thereof from low to high. Since the output of the second NAND circuit NA2 is input to the third switch SW3 as the control signal φ3 (see FIG. 13F), the third switch SW3 is turned ON. Thus, the first integration circuit C1 is discharged in the positive direction at a constant rate of discharge by the discharging bias current source 14 (see FIG. 13H).

When the first RS flip flop circuit 43 receives, as the first set signal set1, a signal that goes low instantaneously, the first NAND circuit NA1 flips its output from high to low. The output of the first NAND circuit NA1 is input to the fifth NAND circuit NA5 as the output signal rsoutl (see FIG. 13L).

The first integration circuit C1 is discharged in the positive direction until the terminal voltage thereof reaches the reference voltage Vref input to the positive-side (+) input terminal, and when the terminal voltage reaches the reference voltage Vref, the output of the first comparison circuit 23 transitions from high to low (see FIG. 13J). The output of the first comparison circuit 23 is input to the first RS flip flop circuit 43 as the first reset signal res1.

In the first RS flip flop circuit 43, as the first reset signal res1 goes from high to low, the output signal rsoutl goes oppositely from low to high, and the output signal is input to the fifth NAND circuit NA5 (see FIG. 13L). Since the second input terminal (rsout2) is at the high level, the fifth NAND circuit NA5 flips the output signal rsoutl and outputs the resulting output signal rsoutl to the switching circuit 2 as the PWM signal PWMout (see FIG. 13N).

In the second period T2, the second switching signal φ2 from the dead time generation circuit 12 is at the high level (see FIG. 13C), whereby the second switch SW2 is ON. Therefore, the second integration circuit C2 is charged in the negative direction by the current (Ic+Δi) from the voltage-current conversion circuit 13 (see FIG. 13I).

When the second switching signal φ2 flips from high to low, the operation transitions to the third period T3, wherein the falling edge detection circuit 42 detects the fall of the second switching signal φ2, and outputs the detection result to the second RS flip flop circuit 44 as the second set signal set2 (see FIG. 13E).

When the second RS flip flop circuit 44 receives, as the second set signal set2, a signal that goes low instantaneously, the fourth NAND circuit NA4 flips its output thereof from low to high. Since the output of the fourth NAND circuit NA4 is input to the fourth switch SW4 as the control signal φ4 (see FIG. 13G), the fourth switch SW4 is turned ON. Thus, the second integration circuit C2 is discharged in the positive direction at a constant rate of discharge by the discharging bias current source 14 (see FIG. 13I).

When the second RS flip flop circuit 44 receives, as the second set signal set2, a signal that goes low instantaneously, the third NAND circuit NA3 flips its output from high to low. The output of the third NAND circuit NA3 is input to the fifth NAND circuit NA5 as the output signal rsout2 (see FIG. 13M).

The second integration circuit C2 is discharged in the positive direction until the terminal voltage thereof reaches the reference voltage Vref input to the positive-side (+) input terminal, and when the terminal voltage reaches the reference voltage Vref, the output of the second comparison circuit 24 transitions from high to low. The output of the second comparison circuit 24 is input to the second RS flip flop circuit 44 as the second reset signal res2 (see FIG. 13K).

In the second RS flip flop circuit 44, as the second reset signal res2 goes from high to low, the output signal rsout2 goes oppositely from low to high, and the output signal is input to the fifth NAND circuit NA5 (see FIG. 13M). Since the second input terminal (rsoutl) is at the high level, the fifth NAND circuit NA5 flips the output signal rsout2 and outputs the resulting output signal rsout2 to the switching circuit 2 as the PWM signal PWMout (see FIG. 13N).

Referring to FIGS. 14A to 14N, where the audio signal eS is positive, the current (Ic+Δi) is large, and the gradient of the voltage waveform at the first end of the first or second integration circuit C1 or C2 is larger than that where the audio signal eS is absent. Therefore, the terminal voltage of the first or second integration circuit C1 or C2 at the time when the level of the first or second switching signal φ1 or φ2 flips from high to low is smaller than that where the audio signal eS is absent, and when they are discharged in the positive direction, the amount of time t from the start of the discharge until the voltage reaches the threshold voltage Vth is longer than that where the audio signal eS is absent. Therefore, the PWM signal PWMout with longer high-level periods is output as shown in FIG. 14N, as compared with that where the audio signal eS is absent as shown in FIGS. 13A to 13N. Thus, it is possible to output the PWM signal PWMout according to the amplitude of the audio signal eS.

Referring to FIGS. 15A to 15N, where the audio signal eS is negative, the current (Ic+Δi) is small, and the gradient of the voltage waveform at the first end of the first or second integration circuit C1 or C2 is also small. Therefore, the terminal voltage of the first or second integration circuit C1 or C2 at the time when the level of the first or second switching signal φ1 or φ2 flips from high to low is larger than that where the audio signal eS is absent, and when they are discharged in the positive direction, the amount of time t from the start of the discharge until the voltage reaches the threshold voltage Vth is shorter than that where the audio signal eS is absent. Therefore, the PWM signal PWMout with shorter high-level periods is output as shown in FIG. 15N, as compared with that where the audio signal eS is absent as shown in FIGS. 13A to 13N.

The third embodiment also provides functions and effects similar to those of the first embodiment, i.e., it is possible to appropriately produce pulse widths of the PWM signal PWMout by converting the voltage information based on the audio signal eS to time information.

Moreover, the third embodiment uses the first and second comparison circuits 23 and 24, and the reference voltage Vref of the first and second comparison circuits 23 and 24 can be adjusted to any value. Therefore, even if the power source voltage fluctuates or there is a voltage fluctuation due to the temperature characteristics, it is possible to reduce the problems by adjusting the reference voltage Vref.

Since the pulse width modulation circuit 41 of the third embodiment is provided with the first and second comparison circuits 23 and 24, as is the pulse width modulation circuit 21 of the second embodiment, the pulse width modulation circuit 41 may be divided into the current source circuit blocks 31A and 31B, the integration circuit blocks 32A and 32B, the voltage comparison circuit blocks 34A and 34B and the logic circuit blocks 35A and 35B, as described above in the second embodiment. Therefore, also with the pulse width modulation circuit 41 of the third embodiment, it is possible to realize functions and effects similar to those of the pulse width modulation circuit 21 of the second embodiment.

It is understood that the scope of the present invention is not limited to the embodiments described above, and the circuit configurations of the first to third embodiments are merely illustrative and can be replaced by any of various other circuits having substantially the same function. For example, while the first and second integration circuits C1 and C2 are once charged in the negative direction and then discharged in the positive direction in the first and third embodiments, the present invention may alternatively employ a pulse width modulation circuit 46 (hereinafter "the fourth embodiment") as shown in FIG. 16 or a pulse width modulation circuit 47 (hereinafter "the fifth embodiment") as shown in FIG. 17, where the first and second integration circuits C1 and C2 are once charged in the positive direction and then discharged in the negative direction to produce the PWM signal PWMout, as with the pulse width modulation circuit 21 of the second embodiment.

Figure 16:
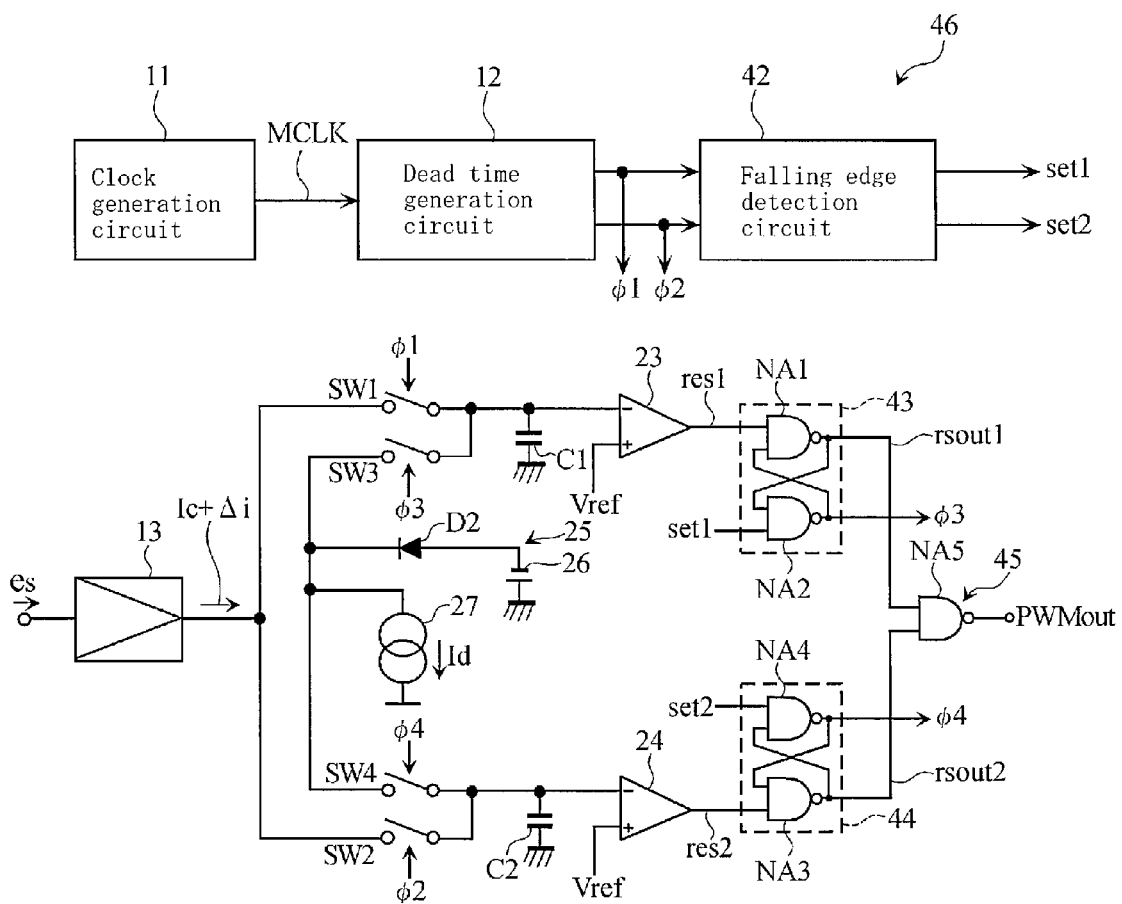
FIG. 16 is a block circuit diagram showing a variation of a pulse width modulation circuit.
Figure 17:
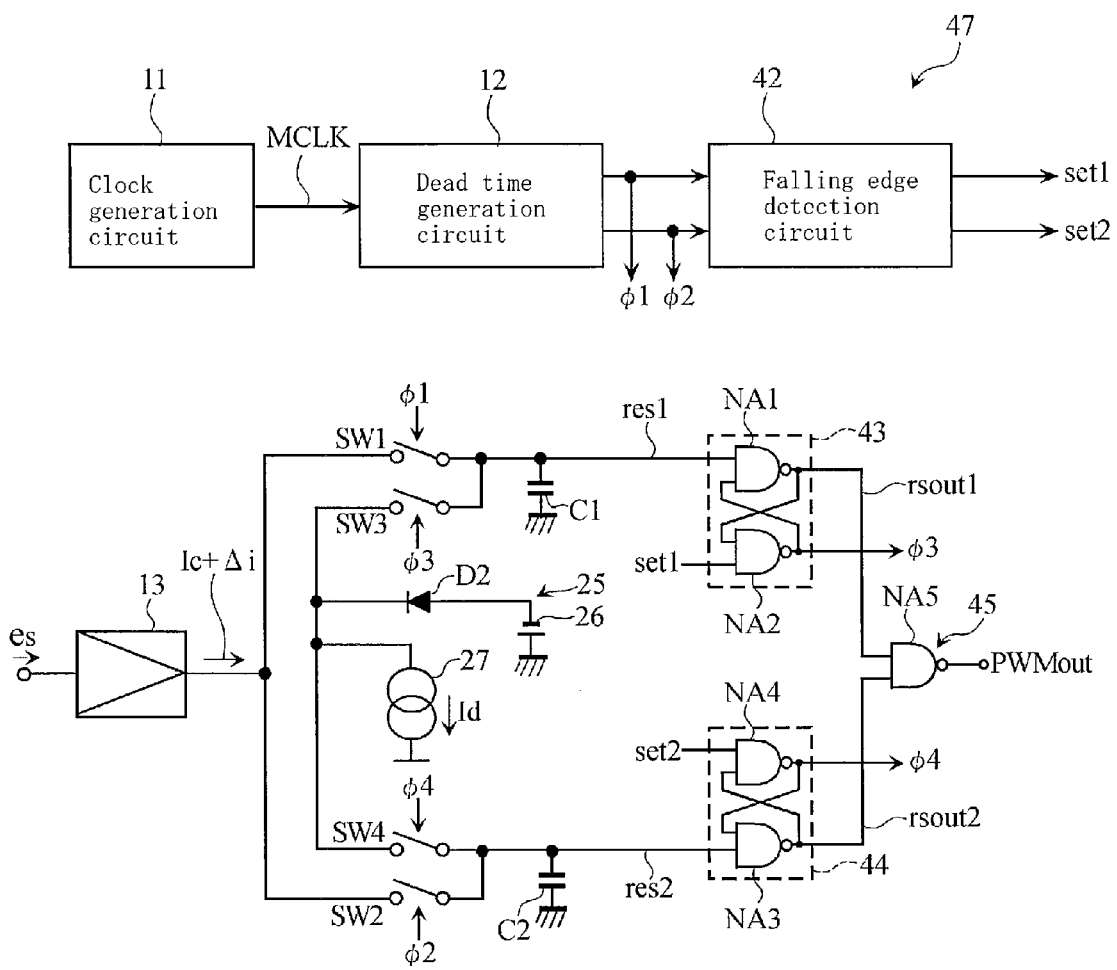
FIG. 17 is a block circuit diagram showing a variation of a pulse width modulation circuit.

The pulse width modulation circuit 46 of the fourth embodiment shown in FIG. 16 employs a circuit configuration that is obtained by replacing a portion of the circuit configuration shown in FIG. 12 from the input terminal of the audio signal eS to the output terminals of the first and second comparison circuits 23 and 24 with a portion of the circuit configuration of the pulse width modulation circuit 21 of the second embodiment shown in FIG. 9 from the input terminal of the audio signal eS to the input terminals of the first and second comparison circuits 23 and 24. The pulse width modulation circuit 47 of the fifth embodiment shown in FIG. 17 is similar to FIG. 16 except that the first and second comparison circuits 23 and 24 are removed.

With the pulse width modulation circuit 46 of the fourth embodiment, the first integration circuit C1 is charged in the positive direction in the first period T1 and discharged in the negative direction in the second period T2, after which it is kept at the reference voltage Vref, as with the second embodiment. The second integration circuit C2 is charged and discharged, as is the first integration circuit C1, except their operations are shifted from each other by half a cycle. Therefore, also with the pulse width modulation circuit 46 of the fourth embodiment, a charging/discharging operation similar to that of the pulse width modulation circuit 21 of the second embodiment is performed by the first and second integration circuits C1 and C2, and the PWM signal PWMout is produced by the first and second RS flip flop circuits 43 and 44 and the signal output circuit 45 in a manner similar to that with the first and second NOR circuits N1 and N2 and the third NOR circuit N3 of the pulse width modulation circuit 21 of the second embodiment, whereby it is possible to output a desirable PWM signal PWMout.

In the pulse width modulation circuit 47 of the fifth embodiment, the first and second comparison circuits 23 and 24 are absent, as compared with the pulse width modulation circuit 46 of the fourth embodiment. However, a charging/discharging operation similar to that of the fourth embodiment is performed by the first and second integration circuits C1 and C2 and a signal producing operation similar to that of the fourth embodiment is performed by the first and second RS flip flop circuits 43 and 44 and the signal output circuit 45, whereby it is possible to output a desirable PWM signal PWMout.

In other embodiments, the sign of the audio signal eS may be reversed in the voltage waveforms shown in FIGS. 4 and 6A to 8H. For example, in the voltage waveforms of FIG. 4, the waveform S1 may be the waveform where the audio signal eS is negative and the waveform S2 may be the waveform where the audio signal eS is positive.

What is claimed is:

1. A pulse width modulation circuit, comprising:

a voltage control circuit for changing a voltage of a first integration circuit based on a current based on an input signal during a first period, being equal to half a cycle of a predetermined clock signal, changing the voltage of the first integration circuit based on a constant bias current in a direction opposite to an increase/decrease direction in the first period while changing a voltage of a second integration circuit being different from the first integration circuit based on a current based on the input signal during a second period shifted from the first period by half a cycle and following the first period, and changing the voltage of the second integration circuit based on the bias current during a third period shifted from the second period by half a cycle and following the second period in a direction opposite to an increase/decrease direction in the second period;

a first detection circuit for detecting an amount of time from a start of the second period until the voltage of the first integration circuit reaches a predetermined reference voltage;

a second detection circuit for detecting an amount of time from a start of the third period until the voltage of the second integration circuit reaches a predetermined reference voltage;

a first voltage keeping circuit for keeping the voltage of the first integration circuit at the reference voltage from when the voltage of the first integration circuit reaches the reference voltage until the start of the third period;

a second voltage keeping circuit for keeping the voltage of the second integration circuit at the reference voltage from when the voltage of the second integration circuit reaches the reference voltage until a start of a fourth period shifted from the third period by half a cycle and following the third period; and a pulse signal generation circuit for generating a pulse signal whose pulse width is equal to the amount of time, which is output alternately from the first detection circuit and the second detection circuit every half cycle of the predetermined clock signal.

2. The pulse width modulation circuit according to claim 1, wherein the voltage control circuit comprises:

a first charging circuit for charging the first integration circuit in a negative direction with respect to a ground potential during the first period; and a second charging circuit for charging the second integration circuit in a negative direction with respect to the ground potential during the second period.

3. The pulse width modulation circuit according to claim 1, wherein the voltage control circuit comprises:

a first discharging circuit for discharging the first integration circuit based on the constant bias current at a constant rate of discharge in a positive direction with respect to the ground potential during the second period; and a second discharging circuit for discharging the second integration circuit based on the constant bias current at a constant rate of discharge in a positive direction with respect to the ground potential during the third period.

4. The pulse width modulation circuit according to claim 2, wherein:

the voltage control circuit comprises a voltage-current conversion circuit for converting a voltage based on the input signal to a current; and the voltage control circuit charges the first integration circuit by means of the first charging circuit based on the current obtained by the voltage-current conversion circuit during the first period, and charges the second integration circuit by means of the second charging circuit based on the current obtained by the voltage-current conversion circuit during the second period.

5. The pulse width modulation circuit according to claim 1, further comprising a switching signal generation circuit for generating a switching signal defining a timing for switching between the various periods based on the predetermined clock signal.

6. The pulse width modulation circuit according to claim 5, wherein:
the first detection circuit comprises a first calculation circuit for calculating an NOR between the switching signal generated by the switching signal generation circuit and a charge voltage stored in the first integration circuit during the second period;
the second detection circuit comprises a second calculation circuit for calculating an NOR between the switching signal generated by the switching signal generation circuit and a charge voltage stored in the second integration circuit during the third period; and
the pulse signal generation circuit generates the pulse signal based on an output of the first calculation circuit and an output of the second calculation circuit.

7. The pulse width modulation circuit according to claim 1, wherein:
the first detection circuit comprises a first comparison circuit for comparing a charge voltage stored in the first integration circuit during the second period with the predetermined reference voltage;
the second detection circuit includes a second comparison circuit for comparing a charge voltage stored in the second integration circuit during the third period with the predetermined reference voltage; and
the pulse signal generation circuit generates the pulse signal based on an output of the first comparison circuit and an output of the second comparison circuit.

8. The pulse width modulation circuit according to claim 7, wherein:
a primary reference line through which a power source current flows for supplying a power source is provided so as to connect together at least the voltage control circuit, the first integrated circuit, the first comparison circuit, the second integrated circuit, the second comparison circuit, and the pulse signal generation circuit;
a part of the voltage control circuit, the first integration circuit and the first comparison circuit are connected together by a common first reference line;
the first reference line is connected to the primary reference line;
another part of the voltage control circuit, the second integration circuit and the second comparison circuit are connected together by a common second reference line;
the second reference line is connected to the primary reference line; and
the pulse signal generation circuit is connected directly to the primary reference line.

9. The pulse width modulation circuit according to claim 1, further comprising:
a switching signal generation circuit for generating a switching signal defining a timing for switching between the various periods based on the clock signal; and
a fall detection circuit for detecting a falling edge of the switching signal generated by the switching signal generation circuit, wherein:
the first detection circuit is implemented by a first flip flop circuit that receives, as a first reset signal, a charge voltage stored in the first integration circuit during the second period and receives, as a first set signal, a falling edge signal of the switching signal detected by the fall detection circuit;
the second detection circuit is implemented by a second flip flop circuit that receives, as a second reset signal, a charge voltage stored in the second integration circuit during the third period and receives, as a second set signal, a falling edge signal of the switching signal detected by the fall detection circuit; and
the pulse signal generation circuit generates the pulse signal based on an output of the first flip flop circuit and an output of the second flip flop circuit.

10. The pulse width modulation circuit according to claim 1, further comprising a clock generation circuit for generating the predetermined clock signal.

11. A switching amplifier, comprising:
the pulse width modulation circuit according to claim 1;
a voltage source for outputting a predetermined power source voltage; and
a switching circuit for switching the predetermined power source voltage supplied from the voltage source based on a modulated signal output from the pulse width modulation circuit.

* * * * *